(12) United States Patent  
Suzuki et al.

(10) Patent No.: US 7,091,463 B2  
(45) Date of Patent: Aug. 15, 2006

(54) SOLID STATE IMAGE PICKUP DEVICE WITH POLYSILICON TRANSFER ELECTRODES

(75) Inventors: Noriaki Suzuki, Miyagi (JP); Kazuaki Ogawa, Miyagi (JP); Tohru Hachiya, Miyagi (JP); Teiji Azumi, Miyagi (JP)

(73) Assignee: Fuji Photo Film Co., LTD, Kanagawa (JP)

( * ) Notice: Subject to any disclaimer, the term of this patent is extended or adjusted under 35 U.S.C. 154(b) by 334 days.

(21) Appl. No.: 10/330,061

(22) Filed: Dec. 30, 2002

(65) Prior Publication Data

US 2003/0132367 A1    Jul. 17, 2003

(30) Foreign Application Priority Data

Jan. 15, 2002    (JP)    ............................. 2002-006150

(51) Int. Cl.
*H01L 27/00*    (2006.01)
*H01L 31/00*    (2006.01)

(52) U.S. Cl. ............................. 250/208.1; 250/214.1; 257/290; 257/222

(58) Field of Classification Search ............. 250/208.1, 250/214.1, 431, 443, 448, 290, 292, 294; 348/302; 257/431, 443, 448, 290, 292, 294, 257/222, 223

See application file for complete search history.

(56) References Cited

U.S. PATENT DOCUMENTS 5,621,461 A * 4/1997 Higashide .................. 348/302

FOREIGN PATENT DOCUMENTS

| JP | 7 106542 | 4/1995 |
| JP | 9-223787 | 8/1997 |
| JP | 2001-308299 | 11/2001 |

* cited by examiner

*Primary Examiner*—Kevin Pyo  
(74) *Attorney, Agent, or Firm*—Arent Fox PLLC

(57) ABSTRACT

Each transfer electrode of a charge transfer unit is made of a main electrode layer and subsidiary electrode layers formed on the side walls of the main electrode layer. The upper surfaces of the transfer electrodes are flush with each other. A charge coupled device having a practically sufficient charge transfer efficiency can be provided. If this charge coupled device is used for an image pickup apparatus, the distance between photoelectric conversion elements and micro lenses can be shortened.

4 Claims, 15 Drawing Sheets

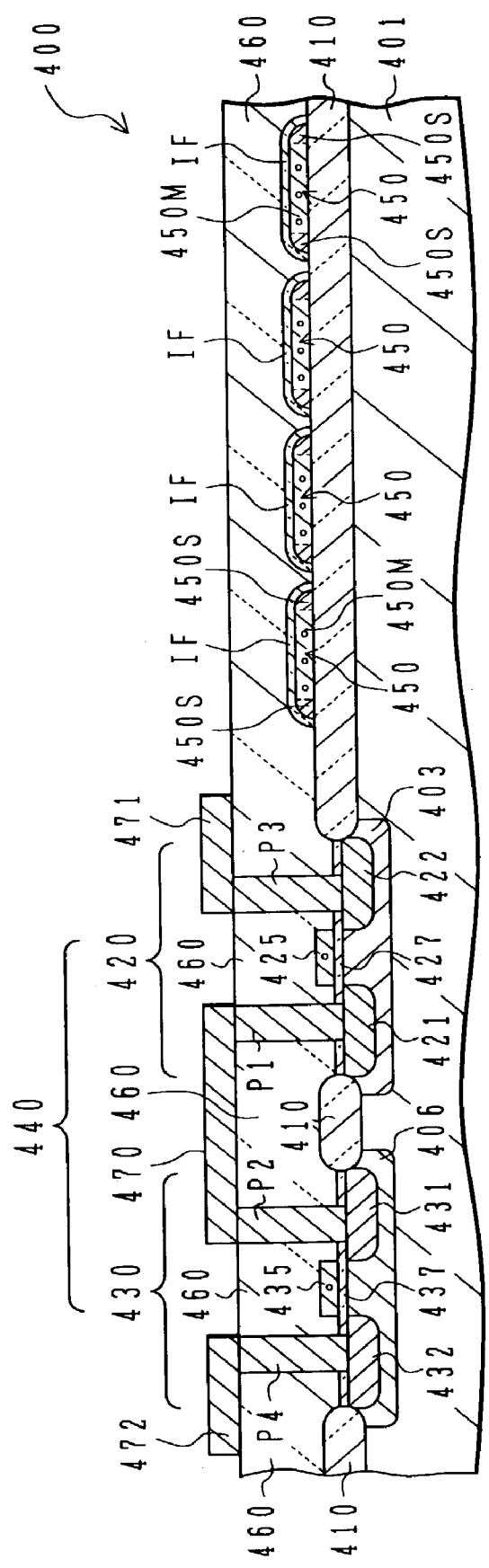

SOLID STATE IMAGE PICKUP DEVICE WITH POLYSILICON TRANSFER ELECTRODES

CROSS REFERENCE TO RELATED APPLICATION

This application is based on Japanese Patent Application No. 2002-006150, filed on Jan. 15, 2002, the entire contents of which are incorporated herein by reference.

BACKGROUND OF THE INVENTION

A) Field of the Invention

The present invention relates to a semiconductor device having a plurality of signal lines formed on the surface of a substrate and its manufacture method, and to a solid state image pickup device fabricated in such a semiconductor device and its manufacture method.

B) Description of the Related Art

A solid state image pickup device can be fabricated by forming in one surface of a substrate a number of photoelectric conversion elements, one or two types of charge transfer units for reading charges from the photoelectric conversion elements and transferring them, and a charge detector circuit for detecting and amplifying the charges output from the charge transfer unit. Solid state image pickup devices are widely used as linear image sensors and area image sensors.

In a charge coupled device (CCD) type solid state image pickup device, charges accumulated in photodiodes are transferred through a vertical CCD (VCCD) and a horizontal CCD (HCCD). A CCD can be formed by forming a channel in the surface layer of a semiconductor substrate and disposing a plurality of electrodes (transfer electrodes) in parallel and crossing the channel on an electrically insulated film formed on the substrate. In order to improve the charge transfer efficiency of the CCD, it is desired to dispose adjacent transfer electrodes as near as possible.

In order to improve the transfer efficiency of the CCD, a so-called overlap structure is adopted. A first polysilicon layer is patterned to form first transfer electrodes. After the surfaces of the first transfer electrodes are oxidized, a second polysilicon layer is deposited and patterned to form second transfer electrodes between first transfer electrodes. In this case, in order not to form a gap between first and second transfer electrodes, the edges of the second transfer electrode are patterned to overlap the first transfer electrodes.

For recent solid state image pickup devices used as area image sensors, the integration degree of photoelectric conversion elements is made high in order to realize a high resolution and the size of each photoelectric conversion element is made correspondingly small.

In solid state image pickup devices used as area image sensors, particularly in single-plate solid state image pickup devices, a micro lens is disposed above each photoelectric conversion element via a passivation film or an organic planarizing film to improve the light convergence efficiency. Also in solid state image pickup devices used as linear image sensors, a micro lens is disposed in some cases above each photoelectric conversion element via an organic planarizing film.

A micro lens can be formed, for example, by pattering a transparent resin (inclusive of photoresist) layer into a predetermined shape by photolithography or the like, melting the transparent resin pattern by heat treatment, rounding the corners of each pattern by surface tension and cooling the pattern. A micro lens is formed from each pattern. The size of a micro lens is becoming smaller as the integration degree of photoelectric conversion elements becomes higher.

A small micro lens is likely to have a focal point higher than a desired position (a focal length shorter than a designed length). In order to set the focal point of a micro lens to a desired position, it is desired to shorten the distance between the micro lens and a corresponding photoelectric conversion element.

This distance is difficult to be shortened because each layer requires to have a predetermined thickness or more.

If a CCD has a single-layer electrode structure, i.e., if CCD transfer electrodes can be formed by patterning a single conductive film, the distance can be shortened.

If a single conductive film is patterned by photolithography to form transfer electrodes, the distance between adjacent transfer electrodes becomes relatively long. In order to obtain CCDs of a single-layer electrode structure having a practically sufficient charge transfer efficiency, it is desired to shorten the distance between adjacent transfer electrodes to about 0.2 μm or shorter.

If highly sophisticated photolithography techniques are used, the distance between adjacent transfer electrodes can be shortened to about 0.13 μm to obtain CCDs of a single-layer electrode structure having a desired charge transfer efficiency. However, high resolution patterning results in an increased manufacture cost.

SUMMARY OF THE INVENTION

An object of this invention is to provide a solid state image pickup device capable of being fabricated with a relatively low manufacture cost and easy to shorten the distance between micro lenses and photoelectric conversion elements, when the micro lenses are formed above the photoelectric conversion elements.

Another object of the invention is to provide a method of fabricating a solid state image pickup device with a relatively low manufacture cost and easy to shorten the distance between micro lenses and photoelectric conversion elements, when the micro lenses are formed above the photoelectric conversion elements.

Still another object of the invention is to provide a semiconductor device having a plurality of signal lines disposed at a short interval and easy to be fabricated with a relatively low manufacture cost.

Still another object of the invention is to provide a method of fabricating a semiconductor device having a plurality of signal lines disposed at a short interval at a relatively low manufacture cost.

According to one aspect of the present invention, there is provided a semiconductor device comprising: a semiconductor substrate having a principal surface; a first insulating layer formed on the principal surface; a train of main electrodes formed on the first insulating layer at a predetermined gap between adjacent main electrodes; and conductive subsidiary electrodes formed on side walls of the main electrode, wherein a width of the main electrode is larger than the predetermined gap.

According to another aspect of the present invention, there is provided a solid state image pickup device comprising: a semiconductor substrate; a number of photoelectric conversion elements disposed in one surface of the semiconductor substrate in rows and columns in a matrix shape; a plurality of first charge transfer channels formed in the surface of the semiconductor substrate along each photoelectric conversion element column; a plurality of first transfer electrodes disposed on an electrically insulating film formed on the surface of the semiconductor substrate along each photoelectric conversion element row, adjacent first transfer electrodes being disposed spaced apart from each other, and each of the first transfer electrodes having a first main electrode layer disposed crossing each of the first charge transfer channels as viewed in plan and first subsidiary electrode layers formed on side walls of the first main electrode layer; a second charge transfer channel formed on the surface of the semiconductor substrate and being electrically connectable to each of the first charge transfer channels; and a plurality of second transfer electrodes disposed on the electrically insulating film formed on the surface of the semiconductor substrate, each of the second transfer electrodes crossing the second charge transfer channel.

According to another aspect of the present invention, there is provided a solid state image pickup device comprising: a semiconductor substrate; a number of photoelectric conversion elements disposed in one surface of the semiconductor substrate at least in one row; a charge transfer channel formed in the surface of the semiconductor substrate along one photoelectric conversion element row; and a plurality of transfer electrodes disposed on an electrically insulating film formed on the surface of the semiconductor substrate, the transfer electrodes being spaced apart from each other, and each of the transfer electrodes including a main electrode layer disposed crossing the charge transfer channel as viewed in plan and subsidiary electrode layers formed on side walls of the main electrode layer.

According to another aspect of the present invention, there is provided a solid state image pickup device comprising: a semiconductor substrate; a number of photoelectric conversion elements disposed in one surface of the semiconductor substrate in rows and columns in a matrix shape; a plurality of first charge transfer channels formed in the surface of the semiconductor substrate along each photoelectric conversion element column, each of the first charge transfer channels being capable of reading and transferring charges accumulated in corresponding photoelectric conversion elements; a plurality of first transfer electrodes disposed on an electrically insulating film formed on the surface of said semiconductor substrate along each photoelectric conversion element row, adjacent first transfer electrodes being disposed spaced apart from each other, and each of said first transfer electrodes having a first main electrode layer disposed crossing each of said first charge transfer channels as viewed in plan and first subsidiary electrode layers formed on side walls of the first main electrode layer; a second charge transfer channel electrically connectable to each of the first charge transfer channels; a light shielding film having an opening above each of the photoelectric conversion elements, the light shielding film being electrically separated from all of the first charge transfer channels and the second charge transfer channel and covering all of the first charge transfer channels and the second charge transfer channel as viewed in plan; an interlayer insulating film having a flat upper surface, made of material containing silicon oxide, and covering the light shielding film and the openings as viewed in plan; and a passivation film disposed on the interlayer insulating film.

According to another aspect of the present invention, there is provided a solid state image pickup device comprising: a semiconductor substrate; a number of photoelectric conversion elements disposed in one surface of the semiconductor substrate at least in one row; a charge transfer channel formed in the surface of the semiconductor substrate along one photoelectric conversion element row; a plurality of transfer electrodes disposed on an electrically insulating film formed on the surface of said semiconductor substrate, said transfer electrodes being spaced apart from each other, and each of said transfer electrodes including a main electrode layer disposed crossing said charge transfer channel as viewed in plan and subsidiary electrode layers formed on side walls of the main electrode layer; an interlayer insulating film having a flat upper surface, made of material containing silicon oxide, and covering the charge transfer channel as viewed in plan; and a passivation film formed on the interlayer insulating film.

According to another aspect of the present invention, there is provided a method of manufacturing a semiconductor device, comprising the steps of: (a) forming charge transfer channels in one surface of a semiconductor substrate; (b) forming an electrically insulating film on the surface of the semiconductor substrate and forming a first conductive layer on the electrically insulating film; (c) patterning the first conductive layer to form a plurality of main electrode layers disposed spaced apart from each other, each forming an independent transfer electrode; (d) forming a second conductive layer covering the main electrodes; and (e) patterning the second conductive layer to form subsidiary electrode layers on side walls of each of the main electrodes.

According to another aspect of the present invention, there is provided a semiconductor device comprising: a semiconductor substrate; an electrically insulating film formed on one surface of the semiconductor substrate; and a plurality of signal lines spaced apart from each other and disposed on the electrically insulating film, each of the signal lines including a main conductive layer and subsidiary conductive layers formed on side walls of the main electrode layer.

According to another aspect of the present invention, there is provided a method of manufacturing a semiconductor device having a plurality of signal lines, comprising steps of: (a) forming an electrically insulating film on one surface of a semiconductor substrate; (b) forming a first conductive layer on the electrically insulating film; (c) patterning the first conductive layer to form main conductive layers constituting the signal lines in a plurality of areas; (d) forming a second conductive layer covering the main conductive layers; and (e) patterning the second conductive layer to form subsidiary electrode layers on side walls of the main conductive layer.

The transfer electrode disposed on the electrically insulating film above the charge transfer channel is made of the main electrode layer and subsidiary electrode layers. Even if the main electrode layers are formed by photolithography, the distance between adjacent transfer electrodes can be shortened by the addition of the subsidiary electrode layers.

A solid state image pickup device having a charge transfer channel with a practically sufficient charge transfer efficiency can be manufactured at a relatively low cost. When micro lenses are disposed above photoelectric conversion elements, the distance between the micro lenses and photoelectric conversion elements can be shortened. When the photoelectric conversion elements are highly integrated, the focal position of the micro lens can be set easily to a desired position.

If the interlayer insulating film as an underlying layer of the passivation film is made of material containing silicon oxide and planarized, the thickness of the passivation film can be made almost uniform. It is possible to reduce the need to form an organic planarizing film on the passivation film.

When micro lenses are disposed above photoelectric conversion elements, the distance between the micro lenses and photoelectric conversion elements can therefore be easily shortened. When photoelectric conversion elements are highly integrated, the focal position of the micro lens can be set to a desired position. When the passivation film is made of material having a high refractive index, light refraction at the surface of the passivation film becomes almost uniform. It is therefore easy to make a large amount of light become incident upon photoelectric conversion elements.

In this specification, "material containing silicon oxide" is used as a general term of silicon oxide (inclusive of spin-on-glass), borophosphosilicate glass (BPSG), phosphosilicate glass (PSG), and borosilicate glass (BSG).

As above, a plurality of signal lines can be formed on a semiconductor substrate at a small pitch and with a relatively low manufacture cost. The integration degree of a semiconductor device can be improved with a relatively low manufacture cost.

When signal lines are used as the transfer electrodes of a charge transfer channel, the distance between photoelectric conversion elements and corresponding micro lenses disposed above the conversion elements of a CCD solid state image pickup device can be shortened with a relatively low manufacture cost. The resolution can be improved while the sensitivity of a CCD solid state image pickup device is prevented from being lowered.

BRIEF DESCRIPTION OF THE DRAWINGS

FIG. 14 is a cross sectional view showing the structure and layout of signal lines of a semiconductor device according to a fourth embodiment.

DESCRIPTION OF THE PREFERRED EMBODIMENTS

Figure 1:
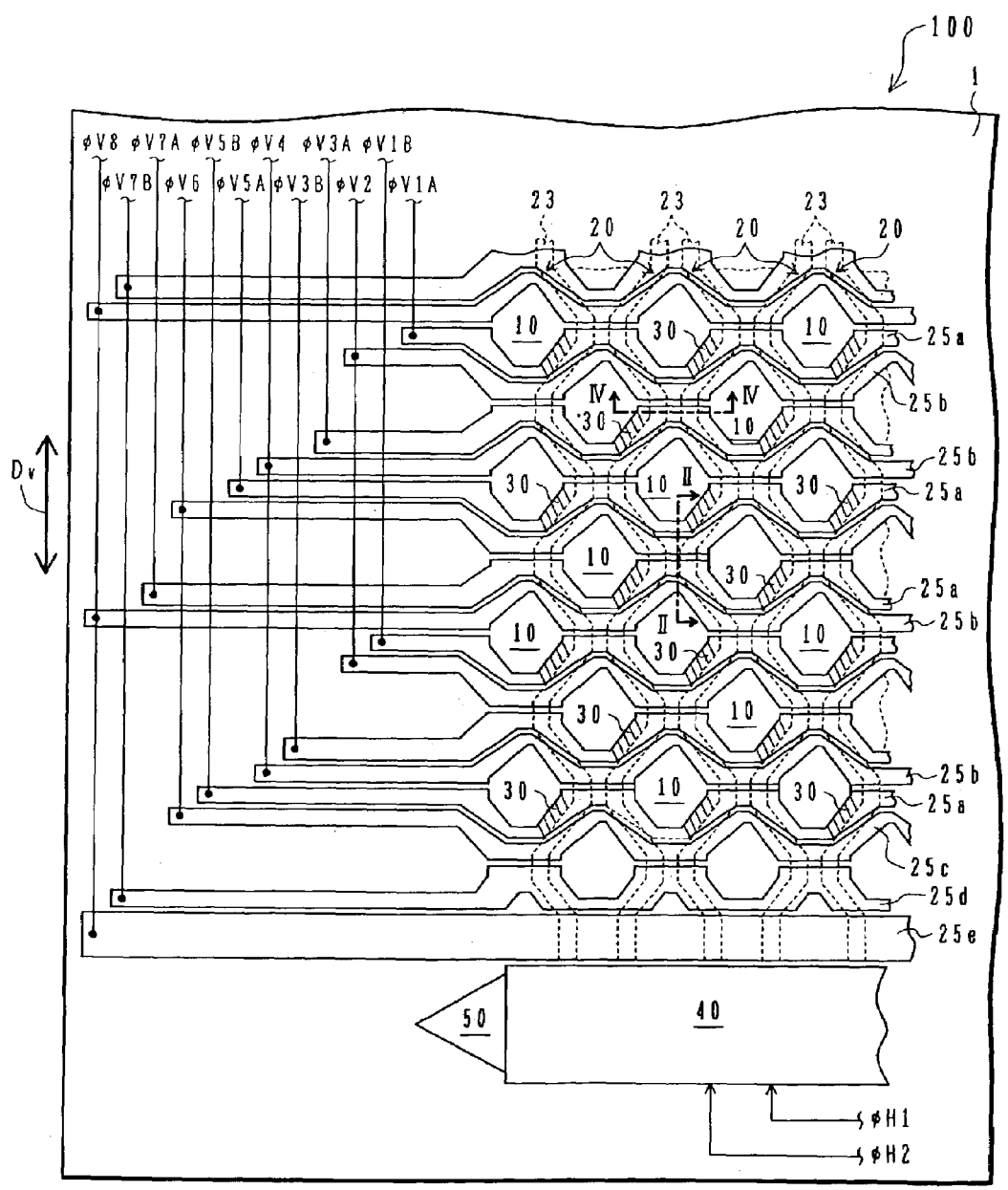
FIG. 1 is a schematic plan view showing the layout of photoelectric conversion elements, first charge transfer units, read gates, a second charge transfer unit and a charge detector circuit respectively of a solid state image pickup device according to a first embodiment.

FIG. 1 is a schematic plan view showing the layout of a solid state image pickup device 100 according to a first embodiment, the image pickup device having photoelectric conversion elements 10, first charge transfer units (vertical charge transfer units) 20, read gates 30, a second charge transfer unit (horizontal charge transfer unit) 40 and a charge detector circuit 50. Although not shown in FIG. 1, a micro lens is disposed above each photoelectric conversion element 10 with predetermined layers being interposed therebetween.

The solid state image pickup device 100 is used as an area image sensor. A number of photoelectric conversion elements 10 are disposed in a pixel shift layout in rows and columns in the surface layer of a semiconductor substrate 1. The total number of photoelectric conversion elements 10 of an actual solid image pickup device used as an area image sensor is about several hundred thousand to several million.

In this specification, the "pixel shift layout" of a number of photoelectric conversion elements is intended to mean that each of photoelectric conversion elements of an even (odd) column is shifted by about a half pitch of photoelectric conversion elements along the column (row) direction from each of photoelectric conversion elements of an odd (even) column (row), and that each photoelectric conversion element column includes only the photoelectric conversion element of even (odd) rows. The "pixel shift layout" is one example of the layout in which a number of photoelectric conversion elements are disposed in rows and columns in a matrix shape.

The phrase "about a half pitch of photoelectric conversion elements along the column (row) direction" is intended to include just a half pitch and other values to be considered substantially equivalent to just a half pitch from the performance of a solid state image pickup device and an image quality although those values are different from just a half value because of manufacture errors, rounding errors of a pixel position in design or mask formation.

Each photoelectric conversion element 10 is made of, e.g., a buried type pn junction photodiode having an octagon shape as viewed in plan. Upon incidence of light, electric charges are accumulated in the photoelectric conversion element 10.

One vertical charge transfer unit 20 is disposed along each photoelectric conversion element column to transfer electric charges accumulated in each photoelectric conversion element 10 to the charge detector circuit 50.

Each vertical charge transfer unit 20 is constituted of CCDs and driven, e.g., by eight-phase drive signals φV1 to φV8 to transfer charges. In the wiring shown in FIG. 1, of the eight-phase drive signals φV1 to φV8, the drive signals φV1, φV3, φV5 and φV7 are divided into two series A and B because of different timings of read pulses to be supplied.

In order to control reading electric charges from the photoelectric conversion elements 10 to the vertical charge transfer unit 20, a read gate 30 is provided for each photoelectric conversion element 10. Read gates 30 are disposed adjacent to each other along the vertical charge transfer unit 20. Each read gate 30 is constituted of a read gate channel region (not shown) formed in the semiconductor substrate and a portion of a first transfer electrode 25a covering the channel region as viewed in plan. In FIG. 1, the read gate 30 is shown hatched in order to make it easy to locate its position.

When a read pulse (e.g., about 15 V) is applied to the first transfer electrode 25a, electric charges are read from the photoelectric conversion elements 10 corresponding to the transfer electrode 25a to the vertical charge transfer unit 20. Reading electric charges from the photoelectric conversion elements 10 to the vertical charge transfer units 20 is performed in the unit of photoelectric conversion element row.

The electric charges read to the vertical charge transfer unit 20 in the unit of photoelectric conversion element row are transferred synchronously from the vertical charge transfer unit 20 down to the horizontal charge transfer unit 40.

The horizontal charge transfer unit 40 is also constituted of CCDs which are driven, for example, by two-phase drive signals φH1 and φH2 to sequentially transfer charges supplied from the vertical charge transfer units 20 to the charge detector circuit 50.

The charge detector circuit 50 sequentially detects the charges transferred from the horizontal charge transfer unit 40 to generate a voltage signal, amplify it and form a pixel signal. This pixel signal is an output signal of the solid state image pickup device 100.

The structure of the vertical charge transfer unit 20 will be detailed.

As shown in FIG. 1, each vertical charge transfer unit 20 has a charge transfer channel (vertical charge transfer channel) 23 formed in the semiconductor substrate and transfer electrodes 25a to 25e juxtaposed in the photoelectric conversion element column direction $D_V$ and formed on an electrically insulating film (not shown) on the semiconductor substrate 1.

Each vertical charge transfer channel 23 is made of, e.g., an n-type channel, and extends in a zigzag way along the corresponding photoelectric conversion element column, and along the photoelectric element column direction $D_V$ as a whole.

Each photoelectric conversion element is disposed surrounded by a downstream transfer electrode 25a and an upstream transfer electrode 25b. The electrodes 25a and 25b are alternately disposed above the charge transfer channel 23. Three transfer electrodes 25c to 25e are juxtaposed in this order downstream of the most downstream transfer electrode 25a. These transfer electrodes 25a to 25e traverse the vertical charge transfer channels 23 as viewed in plan.

In this specification, a motion of charges from the photoelectric conversion element 10 to the charge detector circuit 50 is regarded as one flow. The relative position of each component is identified, if necessary, by a phrase "upstream of something", "downstream of something" or the like.

Figure 2:
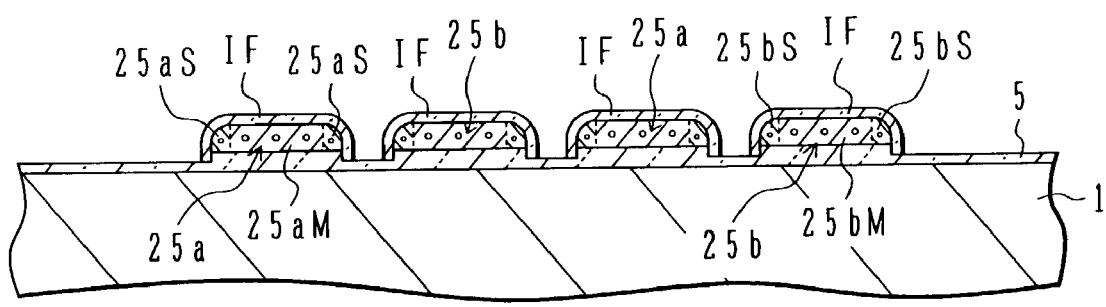
FIG. 2 is a schematic cross sectional view showing the structure and layout of vertical charge transfer electrodes taken along line II—II shown in FIG. 1.

FIG. 2 is a cross sectional view taken along line II—II shown in FIG. 1 and showing the structure and layout of the transfer electrodes 25a and 25b.

The transfer electrodes 25a and 25b are disposed on the surface of the semiconductor substrate 1 via an electrically insulating layer 5. The electrically insulating layer 5 may be a silicon oxide layer, a lamination (NO layer) of a lower oxide silicon layer and an upper silicon nitride layer, an ONO layer having a silicon oxide layer formed on an NO layer, and the like.

The transfer electrode 25a has a striped main electrode layer 25aM and side wall subsidiary electrode layers 25aS formed on the side walls of the main electrode layer 25aM and having a rounded shoulder cross section. The transfer electrode 25b has the same structure. The main electrode layer of the transfer electrode 25b is represented by 25bM and the side wall subsidiary electrode layers are represented by 25bS.

The main electrode layers 25aM and 25bM are made of, e.g., polysilicon (which may be doped with donors or acceptors), metal such as aluminum, tungsten and titanium, or metal silicide such as tungsten silicide.

The side wall subsidiary electrode layers 25aS and 25bS may be made of the same material described above. If the main electrode layers 25aM and 25bM are made of polysilicon, the side wall subsidiary electrode layers 25aS and 25bS may be made of metal suicide by a method to be described later. If the main electrode layers 25aM and 25bM and side wall subsidiary electrode layers 25aS and 25bS are made of polysilicon, a metal silicide layer may be formed on these electrode layers. The metal silicide may be cobalt silicide, chrome silicide, nickel silicide, tungsten silicide, titanium silicide, molybdenum silicide, tantalum silicide or the like.

The transfer electrodes 25a and 25b are spaced apart from the adjacent transfer electrodes 25b and 25a by, for example, about 0.1 µm. The upper surfaces of the transfer electrodes 25a and 25b are approximately flush.

The transfer electrodes 25a and 25b are covered with an electrically insulating film (e.g., thermally oxidized film) IF.

If the electrically insulating film 5 is made of a lamination (ONO film) having a silicon oxide film of about 10 to 70 nm thick, a silicon nitride film of about 20 to 80 nm thick and a silicon oxide film of about 5 to 50 nm thick stacked in this order on the semiconductor substrate 1, the upper silicon oxide film and middle silicon nitride film of the ONO film may be partially removed when the side wall subsidiary electrode layers 25aS and 25bS are formed. FIG. 2 shows this structure.

It is desired in some cases to adjust the potential of a charge transfer channel under an area between the adjacent transfer electrodes and the potential of the charge transfer channel under the transfer electrodes. This adjustment can be made by doping impurities of a predetermined conductivity type under the gap between the adjacent transfer electrodes. If the electrically insulating film 5 is thinned between the adjacent transfer electrodes, it becomes easy to dope impurities under the gap via the thinned electrically insulating film 5.

Although not shown in FIG. 2, the transfer electrodes 25c and 25d also have the similar structure to that of the transfer electrodes 25a and 25b.

The transfer electrodes 25a to 25e may be formed by the following method.

FIGS. 3A to 3E are cross sectional views illustrating the manufacture processes of the transfer electrodes 25a to 25e.

Impurity doped regions such as vertical charge transfer channels 23, channel stoppers to be described later and a horizontal charge transfer channel are formed in predetermined areas of the surface layer of the semiconductor substrate 1, and the electrically insulating layer 5 is formed on the substrate surface, covering the photoelectric conversion elements 10, vertical charge transfer units 20 and horizontal charge transfer unit 40. If necessary, an isolation film may be formed by local oxidation of silicon (LOCOS) or shallow trench isolation (STI) or the like.

Figure 3A:
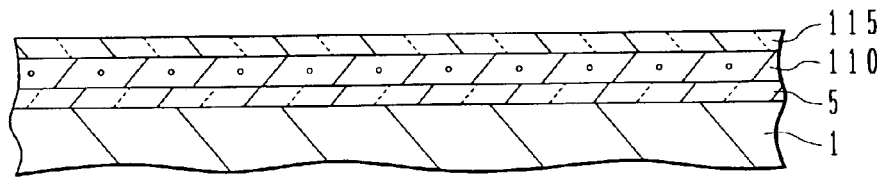
FIGS. 3A to 3E are cross sectional views illustrating the processes of forming vertical charge transfer electrodes.

As shown in FIG. 3A, a conductive layer 110 to be used as the main electrode layer is deposited on an electrically insulating layer 5. On the conductive layer 110, a stopper layer 115 is deposited which is used as an etching stopper during a reactive etching (RIE) process to be described later. If the conductive layer 110 is made of polysilicon, the film thickness is set, for example, to about 0.4 μm. The stopper layer 115 may be a silicon nitride film of about 0.05 μm thick.

Figure 3B:
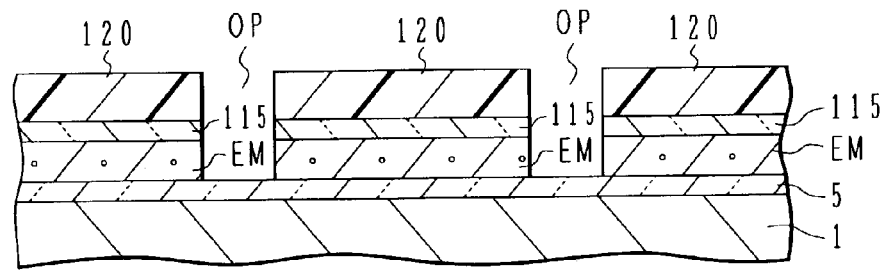

As shown in FIG. 3B, a resist mask 120 having slit openings OP in predetermined areas is formed on the stopper layer 115. By using this resist mask 120 as an etching mask, the stopper layer 115 and conductive layer 110 are etched. The main electrode layers EM of the transfer electrodes are therefore formed.

The resist mask 120 can be formed by coating a photoresist layer on the stopper layer 115 and exposing and developing predetermined regions by photolithography. The width of the opening OP may be about 0.3 μm. After the main electrode layers EM are formed, the resist mask 120 is removed.

Figure 3C:
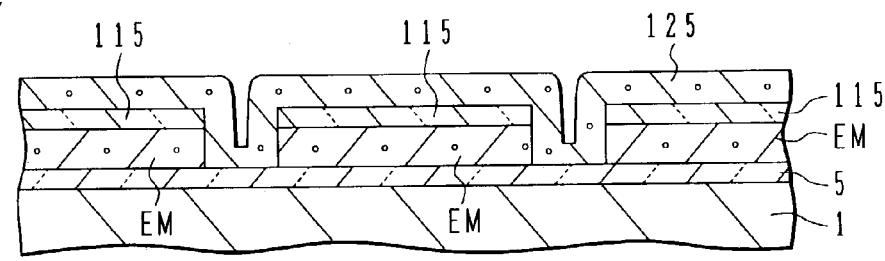

As shown in FIG. 3C, a conductive layer 125 is deposited on the stopper layer 115 and on the exposed surface of the electrically insulating layer 5. The thickness of the conductive layer 125 above the main electrode layers EM is preferably set thinner than a half of the distance between adjacent main electrode layers EM.

If the distance between adjacent main electrode layers EM is short, the thickness of the deposited conductive layer 125 may change at positions above the main electrode layers, on the side walls of the main electrode layers, and on the electrically insulating layer 5 in the gap region. The deposition conditions are selected so that the conductive layers 125 on the side walls become near to each other, e.g., about 0.1 μm.

If the conductive layer 110 is made of polysilicon, a natural oxide film formed on the surface of the main electrode layer EM is removed by, for example, a gas phase hydrofluoric acid process, before the conductive layer 125 is deposited. After the conductive layer 125 is deposited or after a later-described side wall subsidiary electrode layer ES is formed, donors such as phosphorous are diffused into the main electrode layer EM via the conductive layer 125 or side wall subsidiary electrode layer ES. In this case, it is preferable that the conductive layer 125 is also made of polysilicon.

Figure 3D:
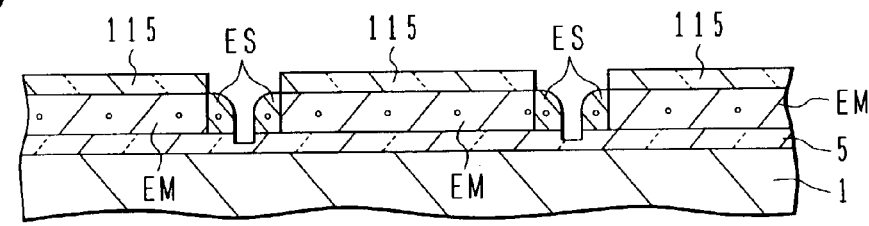

As shown in FIG. 3D, by using the stopper layer 115 as an etching stopper, the conductive layer 125 is anisotropically etched by RIE or the like to leave the conductive layer 125 only on the side walls of each main electrode layer EM. It is preferable that the upper surface of the left conductive layer 125 is flush with or lower than the surface of the main electrode layer EM. The side wall conductive layers 125 left on the side walls of the main electrode layer EM are used as the side wall subsidiary electrode layers ES. Transfer electrodes each including the main electrode layer EM and side wall subsidiary electrode layer ES are therefore formed. The side wall subsidiary electrode layer ES has a rounded shoulder cross section.

Since the conductive layer 125 is patterned by RIE, charge-up is not likely to occur and the micro loading effect is hard to be presented. The conductive layer 125 is therefore easy to be patterned into a desired shape.

Etching gas to be used when the conductive layer 125 is etched by RIE is selected in accordance with the material of the conductive layer 125. For example, if the conductive film 125 is made of polysilicon, chlorine gas may be used for RIE. If the conductive layer 125 is made of tungsten, sulfur hexafluoride ($SF_6$) gas or tetrafluoromethane ($CF_4$) gas may be used for RIE.

If the electrically insulating layer 5 is made of an ONO film, the upper silicon oxide film and middle silicon nitride film of the ONO film may be locally etched as shown in FIG. 2 when the conductive layer 125 is etched. If the conductive layer 125 is thick above the main electrode layer EM and thin on the electrically insulating layer 5, the upper silicon oxide film and middle silicon nitride film of the ONO film can be easily removed between adjacent main electrode layers when the conductive layer 125 is etched.

If the charge transfer channel is made of an n-type impurity doped region, the potential of the charge transfer channel becomes deep under an area between adjacent transfer electrodes, which may cause charge accumulation. In such a case, p-type impurities such as boron are implanted into the charge transfer channel between adjacent transfer electrodes so that the potential of the charge transfer channel under the transfer electrode can be set approximately equal to the potential of the charge transfer channel under an area between adjacent transfer electrodes.

When photoelectric conversion elements 10 are formed after the transfer electrodes are formed, the electrically insulating layer 5 is once removed in the regions where the photoelectric conversion elements 10 are to be formed, and then new silicon oxide films (e.g., thermally oxidized films) are formed in these exposed regions of the surface of the semiconductor substrate 1. If the electrically insulating layer 5 between adjacent transfer electrodes is made thin when the conductive layer 125 is etched, the new silicon oxide films can be formed easily.

Figure 3E:
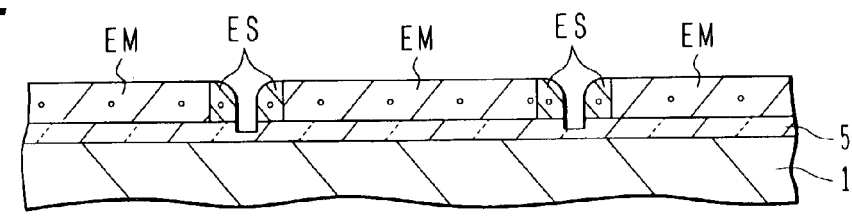

As shown in FIG. 3E, the stopper layer 115 is removed. If the stopper layer 115 is made of a silicon nitride film, the stopper layer 115 can be removed by using hot phosphoric acid.

With the above-described processes, the side wall auxiliary electrode layers ES of the transfer electrodes 25a to 25e are formed on the side walls of the main electrode layer EM, the side wall auxiliary electrode layer having a thickness (on the side wall of the main electrode layer EM) approximately equal to the thickness of the conductive layer 125. Even if the main electrode layers EM are formed at an interval of about 0.3 μm, the distance between a pair of ones of adjacent transfer electrodes 25a to 25e can be made shorter than 0.3 μm. The thickness of the conductive layer 125 can be easily controlled at a higher precision than the patterning precision of photolithography techniques. A plurality of transfer electrodes 25a to 25e can be disposed at a desired pitch.

If the distance between adjacent transfer electrodes is set to about 0.2 μm or shorter, the vertical charge transfer unit 20 having a practically sufficient charge transfer efficiency can be formed. If the distance between adjacent electrodes is set to about 0.1 μm or shorter, a practically sufficient charge transfer efficiency can be obtained even if the vertical charge transfer unit 20 is driven by vertical drive signals $\phi V1$ to $\phi V8$ at the high level of 0 V and low level of −8 V.

The transfer electrodes 25a to 25e can be made thinner than when the transfer electrodes of the overlap electrode structure are formed. Even if a micro lens is disposed above the photoelectric conversion element 10, the distance between the micro lens and photoelectric conversion element 10 can be made short.

Figure 4:
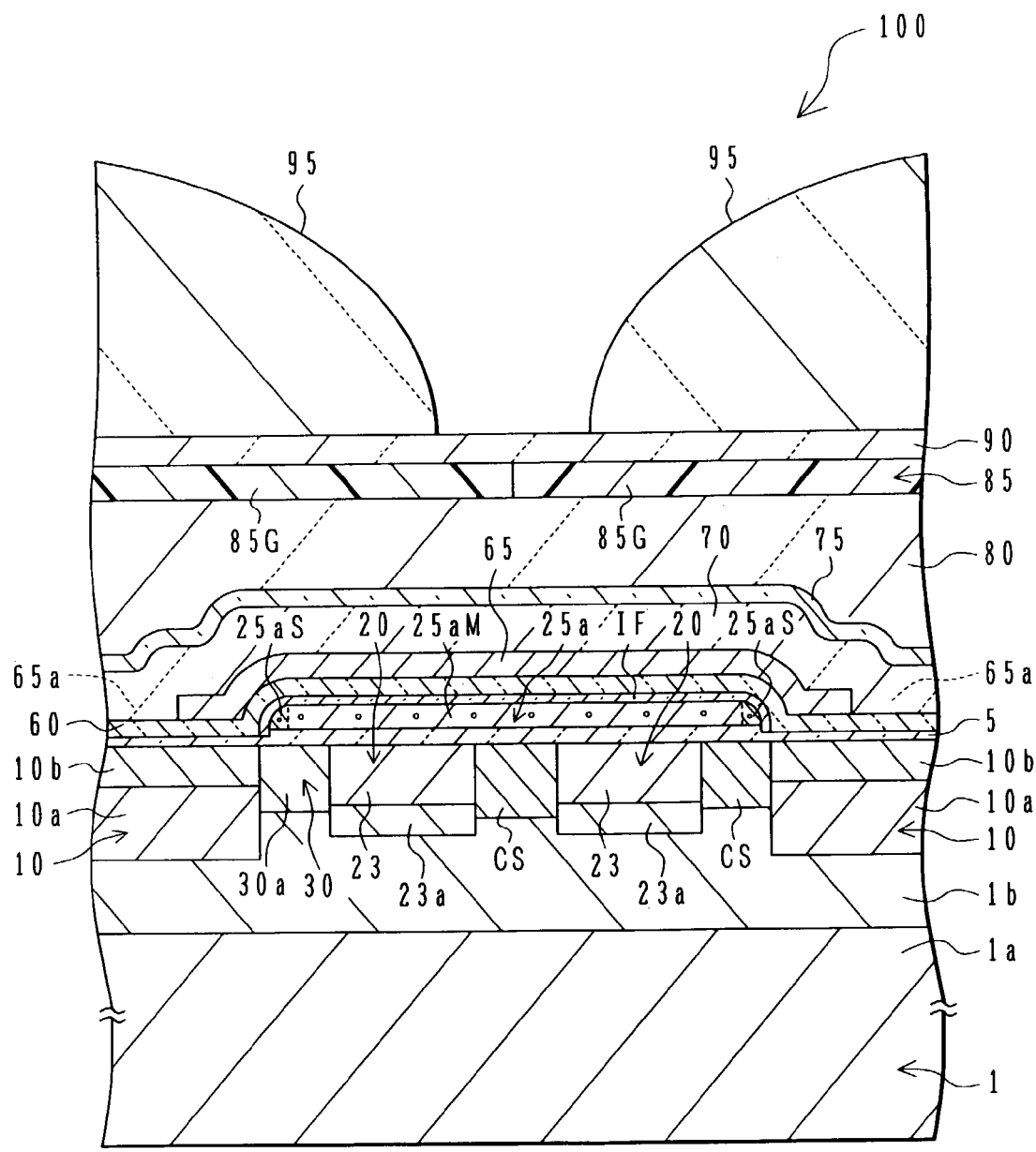
FIG. 4 is a cross sectional view taken along line IV—IV shown in FIG. 1.
Figure 5:
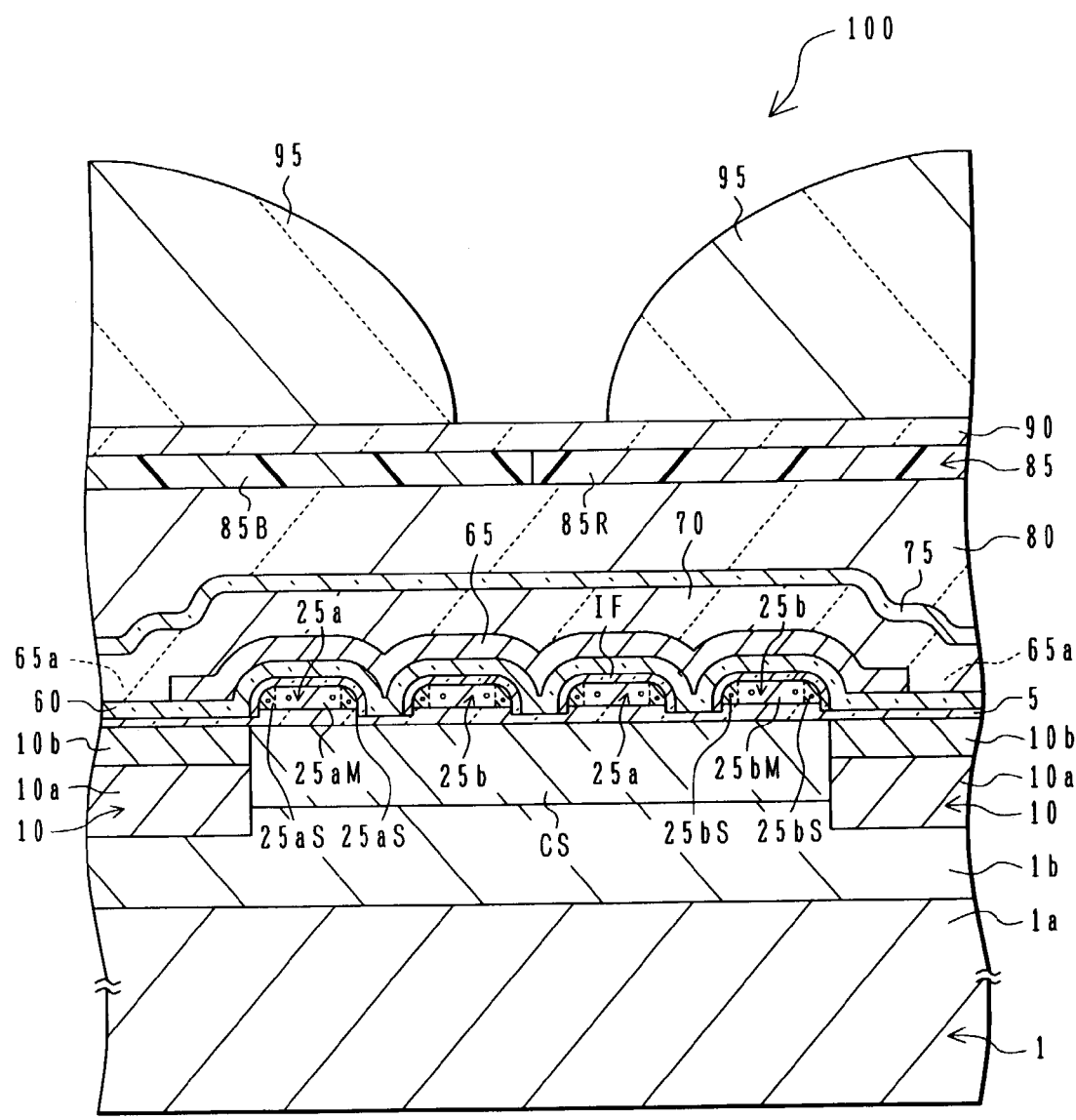
FIG. 5 is a cross sectional view taken along line II—II shown in FIG. 1.

FIGS. 4 and 5 are cross sectional views showing the structure of a solid state image pickup device 100 with micro lenses although these lenses are not shown in FIG. 1. FIG. 4 is a cross sectional view taken along line IV—IV shown in FIG. 1, and FIG. 5 is a cross sectional view taken along line II—II shown in FIG. 1. In FIGS. 4 and 5, like elements to those shown in FIGS. 1 and 2 are represented by the identical reference numerals and symbols and the description thereof is omitted.

A semiconductor substrate 1 has an n-type silicon substrate 1a and a p⁻ type impurity doped region (well) 1b formed in the surface layer of the silicon substrate 1a. The impurity concentration of an impurity doped region of the same conductivity type is represented by p⁻ type, p-type or p⁺-type, or n⁻ type, n-type or n⁺-type in the order of a lower impurity concentration.

A photoelectric conversion element 10 is formed by forming a buried type photodiode. For example, the photodiode may be formed by forming an n-type impurity doped region 10a in a predetermined area of a p⁻-type impurity doped region 1b and by forming a p⁺-type impurity doped region 10b in the surface layer of the n-type impurity doped region 10a. The n-type impurity doped region 10a functions as a charge accumulating region.

In FIG. 4, a p-type impurity doped region 30a is formed along the right side edge of the n-type impurity doped region 10a. The p-type impurity doped region 30a is used as the channel region of the read gate 30.

If necessary, a p-type impurity doped region 23a is formed under the vertical charge transfer channel 23.

A channel stop region CS is formed around the photoelectric conversion element 10, around the vertical charge transfer channel 23 and around a horizontal charge transfer channel 43 (refer to FIG. 6) respectively as viewed in plan, excepting the region where the channel region 30a is formed. The channel stop region CS is made of, for example, a p⁺-type impurity doped region.

Each impurity doped region can be formed by, for example, ion implantation of desired impurities and annealing to follow. The p⁻-type impurity doped region 1b may be formed by epitaxial growth. Each photoelectric conversion element 10 may be formed before or after the vertical charge transfer units 20 are formed.

An electrically insulating film 60, a light shielding film 65, an interlayer insulating film 70, a passivation film 75, a planarizing film 80, a color filter array 85 and a planarizing film 90 are sequentially formed in this order above the vertical charge transfer units 20, horizontal charge transfer unit 40 (refer to FIG. 1) and photoelectric conversion elements 10. Micro lenses 95 are formed on the planarizing film 90.

The electrically insulating layer 60 is made of, for example, silicon oxide to provide an electrical insulation between the light shielding film 65 and underlying transfer electrodes 25a to 25e.

The light shielding film 65 is made of metal material such as tungsten, aluminum, chrome, titanium and molybdenum or alloy material of two or more of these metals, and covers the vertical charge transfer units 20 and horizontal charge transfer unit 40 to prevent unnecessary photoelectric conversion in the area other than the photoelectric conversion elements 10. The light shielding film 65 has an opening 65a above each photoelectric conversion element 10. The area of the photoelectric conversion element 10 corresponding to the opening 65a is a light incidence plane of the photoelectric conversion element 10. Wiring lines for the vertical charge transfer units 20 and horizontal charge transfer unit 40 may be formed by the same layer as the light shielding film 65 in the area other than the light reception area.

If the wiring lines are made of the material different from that of the light shielding film 65, the wiring lines are formed on the interlayer insulating film 70. The interlayer insulating film 70 is made of, for example, a silicon oxide film and prevents a short circuit between the transfer electrodes and wiring lines. If the wiring lines are made of the same material as that of the light shielding film 65, the interlayer insulating film 70 may be omitted. If the electrically insulating film 60 is made thick, this film may be used as the interlayer insulating film.

The passivation film 75 is made of, for example, a silicon nitride film or the like and protects the underlying films.

The planarizing film 80 is made of organic material such as photoresist, and provides a flat surface on which the color filter array 85 is formed. Since steps formed by the transfer electrodes can be made low, steps on the surface of the passivation film 75 can also be made low. The planarizing film 80 for canceling out the steps can be made thin.

The color filter array 85 is provided for a color solid state image pickup device. The color filter array can be omitted for a black and white solid state image pickup device. For a color single-plate solid state image pickup device, a primary or complementary color filter array is used. In FIG. 4 two green filters 85G are shown and in FIG. 5 one blue filter 85B and one red filter 85R are shown.

The planarizing film 90 is made of organic material such as photoresist, cancels out steps of the color filter array 85 and provides a flat surface for the micro lenses 95.

The micro lens 95 is provided for each photoelectric conversion element 10. As described earlier, the micro lens 95 can be formed by pattering a transparent resin (inclusive of photoresist) layer into a predetermined shape by photolithography or the like, melting the transparent resin pattern by heat treatment, rounding the corners of each pattern by surface tension and cooling the pattern. A micro lens 95 is formed from each pattern.

As seen from FIGS. 4 and 5, a relatively large number of layers exist between the upper surface of the photoelectric conversion elements 10 and the lower surface of the micro lenses 95. The number of layers does not change even if the integration degree of the photoelectric conversion elements 10 is raised.

As the size (as viewed in plan) of each photoelectric conversion element 10 becomes small as the photoelectric conversion elements are highly integrated, the size of the micro lens 95 also becomes small. If the micro lens is formed by melting a resin layer pattern and utilizing the surface tension, the radius of curvature of a small lens is likely to become small and the focal point thereof is likely to become high (on the side of the micro lens 95).

As the transfer electrodes 25a to 25e are made of a single conductive layer, the electrodes can be made lower than when the transfer electrodes of the overlap electrode structure are formed. The distance between the upper surface of the photoelectric conversion elements 10 and the lower surface of the micro lenses 95 can be made short. Even if the size of the photoelectric conversion element 10 is made small, the focal point of the micro lens 95 can be easily controlled to take a desired position.

As compared to the overlap electrode structure, steps formed near the photoelectric conversion elements 10 can be made low. Therefore, light even having a large incidence angle is not disturbed by the light shielding film and the like and becomes easy to be incident upon the surface of the semiconductor substrate 1. It becomes easy to make a necessary thickness of the planarizing film 80 thin.

For these reasons, the resolution of the solid state image pickup device 100 can be improved easily by highly integrating the photoelectric conversion elements 10 while the sensitivity of the solid state image pickup device 100 is prevented from being lowered. For an image pickup apparatus utilizing the solid image pickup device 100, it becomes possible to suppress a large change in the sensitivity of the solid state image pickup device to be caused by the F value of the image pickup optical system.

The transfer electrodes 25a to 25e for the vertical charge transfer unit (VCCD) 20 and the transfer electrodes for the horizontal charge transfer unit (HCCD) 40 are generally formed by the same processes. If the VCCD transfer electrodes 25a to 25e are formed to have the structure described above, it is preferable to form the HCCD transfer electrodes having the same structure.

Figure 6:
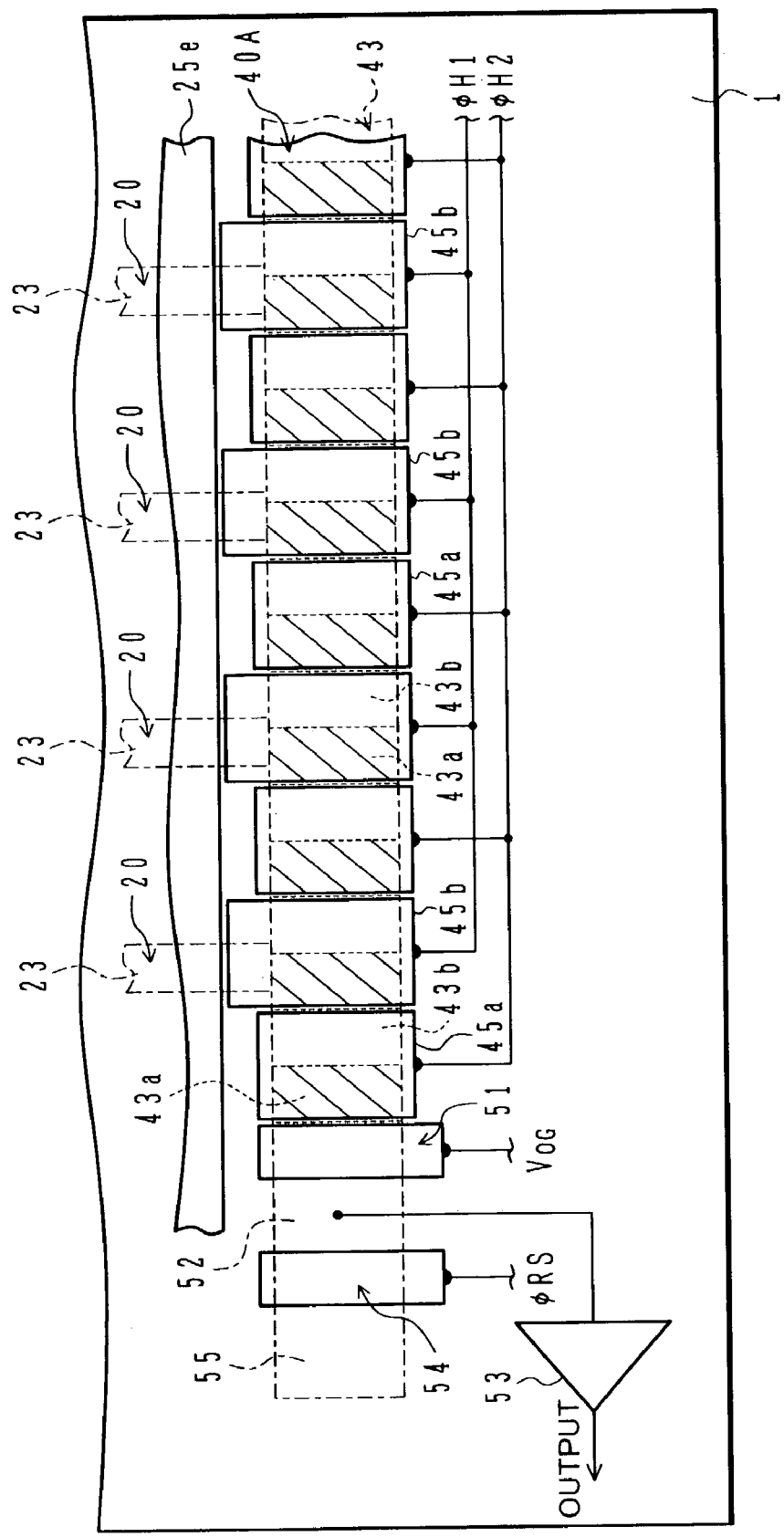
FIG. 6 is a plan view showing an example of horizontal charge transfer electrodes.

FIG. 6 is a schematic plan view showing an example (40A) of HCCD 40 and an example of the structure of the charge detector circuit 50.

In FIG. 6, similar constituent elements to those shown in FIG. 1 are represented by the identical reference numerals and symbols and the description thereof is omitted.

A horizontal charge transfer unit (HCCD) 40A has a horizontal charge transfer channel 43 formed in the surface layer of a semiconductor substrate 1 and two types of transfer electrodes 45a and 45b crossing the horizontal charge transfer channel 43 as viewed in plan.

The horizontal charge transfer channel 43 has the structure that an n-type impurity doped region 43a and an n⁻-type impurity doped region 43b are alternately disposed from the downstream side to the upstream side. One vertical charge transfer unit 20 is provided with two n-type impurity doped regions 43a and two n⁻-type impurity doped regions 43b. In FIG. 6, the n-type impurity doped region 43a is shown hatched to make it easier to distinguish between the n-type impurity-doped region 43a and the n⁻-type impurity doped region 43b.

Two transfer electrodes 45a and 45b per one vertical charge transfer unit 20 are alternately disposed from the downstream side to the upstream side. The transfer electrode 45a or 45b covers the n-type impurity doped region 43a and the n⁻-type impurity doped region 43b disposed upstream of the region 43a as viewed in plan.

The transfer electrode 45a is supplied with a horizontal drive signal $\phi$H2 and the transfer electrode 45b is supplied with a horizontal drive signal $\phi$H1. The transfer gate 45b also functions as the gate electrode for controlling the transfer of charges from the vertical charge transfer unit 20 to the horizontal charge transfer unit 40A.

Similar to the transfer electrodes 25a and 25b described with reference to FIG. 2, each of the transfer electrodes 45a and 45b has a striped main electrode layer and side wall subsidiary electrode layers formed on the side walls of the main electrode layer and having a rounded shoulder shape. The upper surfaces of the transfer electrodes 45a and 45b are generally flush with each other.

Each of the transfer electrodes 45a and 45b is covered with an electrically insulating film made of, for example, a silicon oxide film (thermally oxidized film).

The number of photo masks necessary for fabricating the horizontal charge transfer unit 40A having the above-described structure is reduced by one as compared to the overlap electrode structure.

The horizontal charge transfer unit 40A is driven by two-phase horizontal drive signals $\phi$H1 and $\phi$H2 to sequentially transfer charges received from the vertical charge transfer units 20 to the charge detector circuit 50.

The charge detector circuit 50 has: an output gate 51 connected to the output end of the horizontal charge transfer unit 40A; a floating diffusion (FD) region 52 formed in the semiconductor substrate 1 adjacent to the output gate 51; a floating diffusion amplifier (FAR) 53 electrically connected to the FD region; a reset gate 54 disposed adjacent to the FD region 52; and a drain region 55 formed in the semiconductor substrate 1 adjacent to the reset gate 54. The FD region 52, reset gate 54 and drain region 55 constitute a reset transistor.

The output gate 51 is supplied with a d.c. voltage $V_{OG}$ to transfer charges from the horizontal charge transfer unit 40A to the FD region 52.

FAR 53 amplifies a potential change in the FD region 52 caused by an amount of transferred charges and generates a pixel signal. This pixel signal is an output of the solid state image pickup device 100.

Charges after the detection by FAR 53 or charges not necessary to be detected by FAR 53 are drained into the drain region 55 via the reset gate 54 and absorbed in, for example, a power supply voltage $V_{DD}$. The operation of the reset gate 54 is controlled by a drive signal $\phi$RS.

Next, a solid state image pickup device according to a second embodiment will be described.

Figure 7:
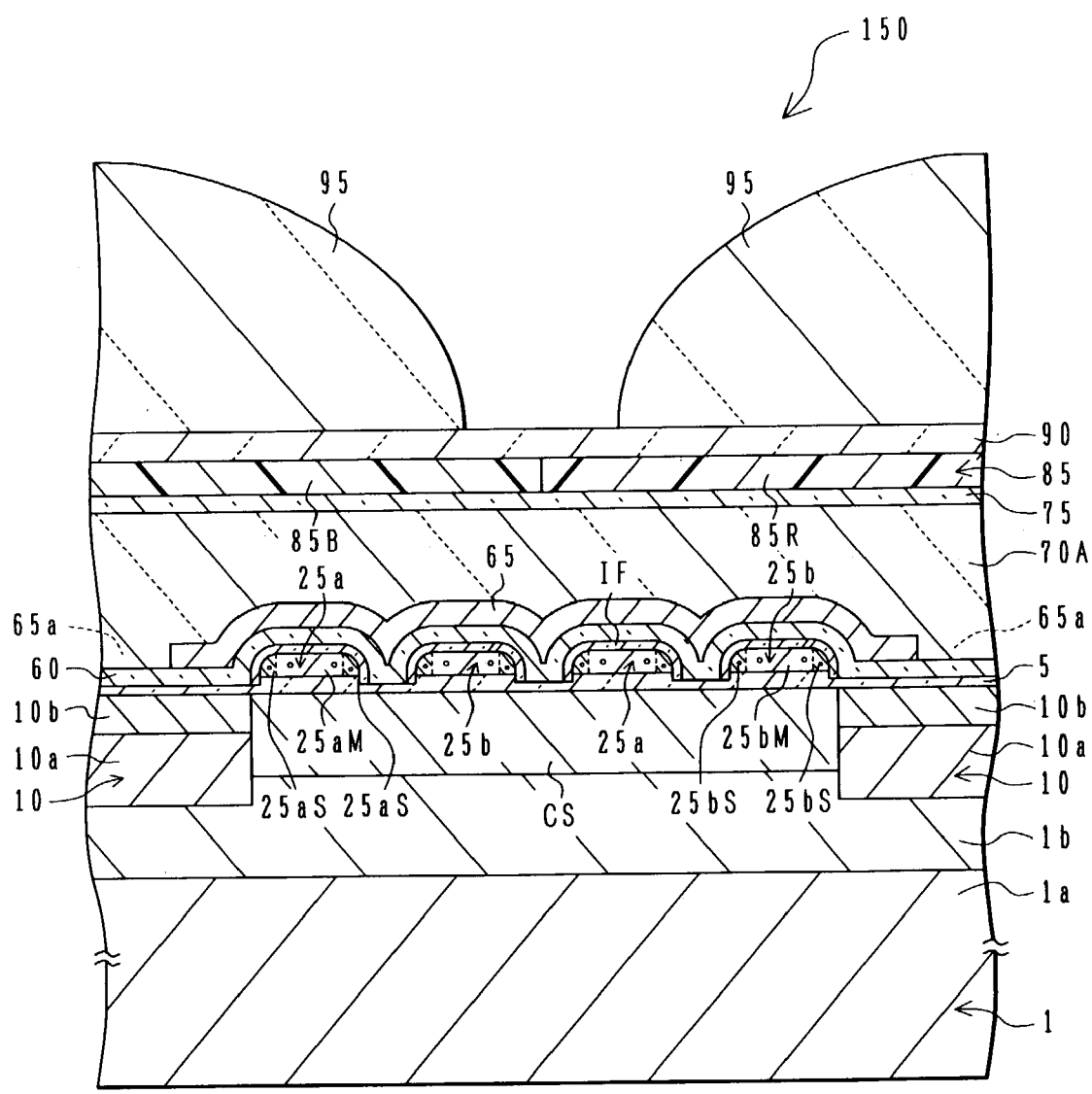
FIG. 7 is a cross sectional view of a solid state image pickup device according to a second embodiment of the invention.

FIG. 7 is a schematic cross sectional view showing the structure of a solid state image pickup device 150 of the second embodiment. In FIG. 7, constituent elements common to those shown in FIG. 5 are represented by the identical reference numerals and symbols and the description thereof is omitted. An interlayer insulating film is represented by a new reference symbol 70A.

As seen from the comparison between FIGS. 7 and 5, the solid state image pickup device 150 is different from the solid state image pickup device 100 of the first embodiment in that the interlayer insulating film 70A and a passivation film 75 have a flat upper surface and that the planarizing film 80 is omitted.

The interlayer insulating film 70A is made of, for example, material containing silicon oxide such as BPSG, PSG, BSG and silicon oxide (inclusive of spin-on-glass). This interlayer insulating film 70A is slightly thicker than the interlayer insulating film 70 shown in FIG. 5, and is formed in such a manner that the film 70A above the central area of the photoelectric conversion element 10 has a thickness of about 1 μm.

The surface of the interlayer insulating film 70A is planarized by reflow, etch-back, chemical mechanical polishing (CMP) or the like. If the interlayer insulating film 70A is formed by using coating material such as spin-on-glass, the surface of the film can be planarized without a planarizing process if the integration degree of the photoelectric conversion elements 10 is as high as necessary.

By planarizing the interlayer insulating film 70A, the passivation film 75 formed on the interlayer insulating film 70A is planarized by itself. By omitting the planarizing film 80 shown in FIG. 5, the color filter array 85 can be formed on the passivation film 75.

As compared to the layer structure shown in FIG. 5, since the planarizing film 80 is omitted, the distance between the upper surface of the photoelectric conversion elements 10 and the lower surface of the micro lenses 95 can be shortened easily. Even if the size of the photoelectric conversion element 10 is made small, the focal point of the micro lens 95 can be controlled easily.

Similar to the layer structure shown in FIG. 5, light having a large incidence angle relative to the surface of the semiconductor substrate 1 can easily become incident upon the photoelectric conversion element 10. Since the surface of the passivation film 75 is flat, refraction of light at the surface of the passivation film 75 is almost uniform so that a larger amount of light can easily become incident upon the photoelectric conversion element 10.

The resolution of the solid state image pickup device 150 can be easily improved by highly integrating the photoelectric conversion elements 10 while the sensitivity is prevented from being lowered. It is possible to prevent the sensitivity of an image pickup apparatus using the solid state image pickup device 150 from being changed greatly by the F value of the image pickup optical system.

A change in the sensitivity and horizontal shading factor of a solid state image pickup device having vertical charge transfer units of the overlap electrode structure was measured by changing planarization of the interlayer insulating film, and the relation between the F value of the image pickup device and the sensitivity was also measured.

Figure 8:
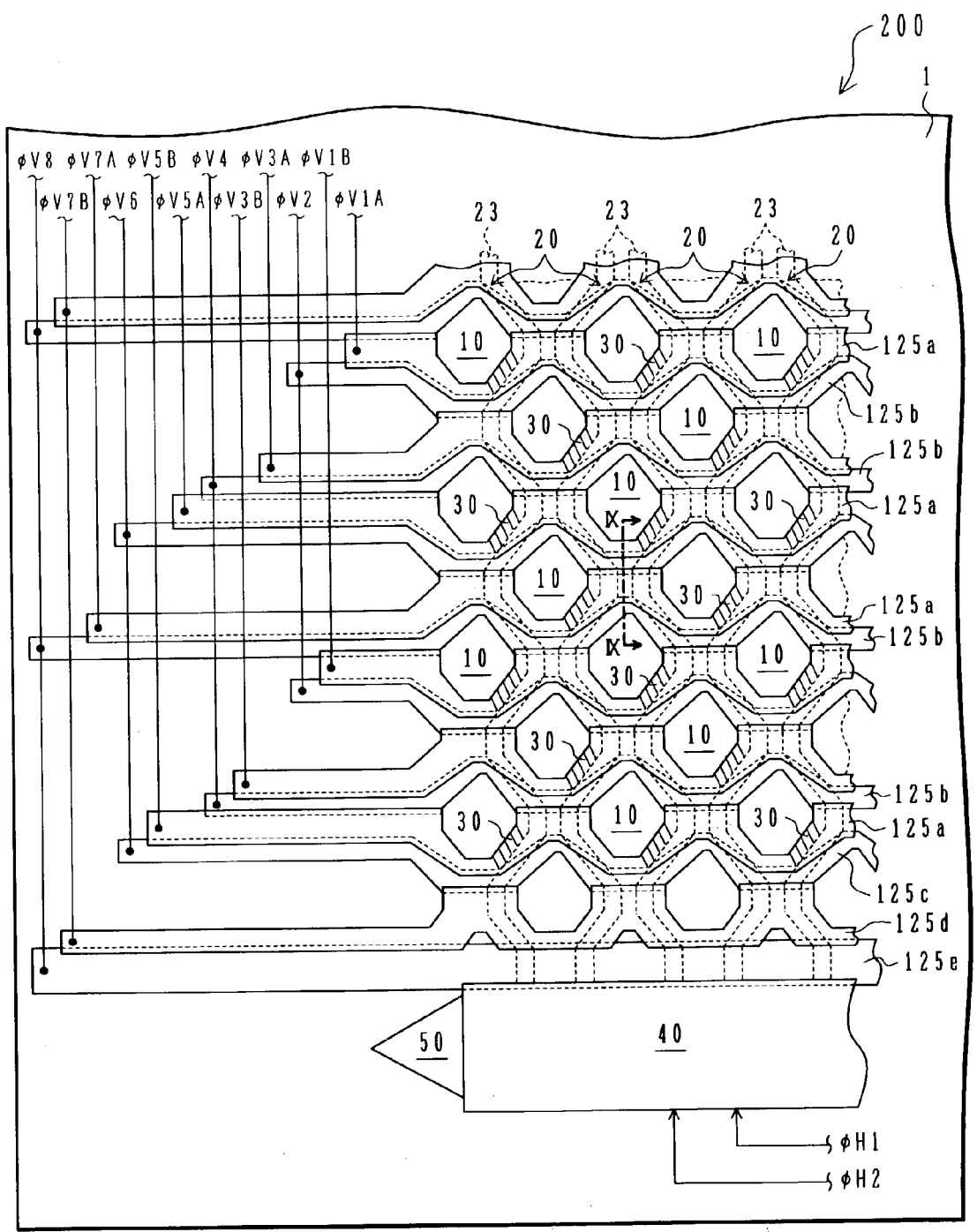
FIG. 8 is a plan view showing the layout of photoelectric conversion elements, vertical charge transfer units, read gates, a horizontal charge transfer unit and a charge detector circuit respectively of a solid state image pickup device according to a prior art.

FIG. 8 is a schematic plan view showing the layout of photoelectric conversion elements 10, vertical charge transfer units 20, read gates 30, a horizontal charge transfer unit 40 and a charge detector circuit 50 respectively of a conventional solid state image pickup device 200 (hereinafter called a "test device"). Although not shown, red, green and blue color filters are disposed above the photoelectric conversion elements 10, and micro lenses are disposed above the color filters. In the test device, the number of photoelectric conversion element rows is smaller than the number of photoelectric conversion element columns, and the width along the photoelectric conversion element column is narrower than that along the photoelectric conversion element row.

Figure 9:
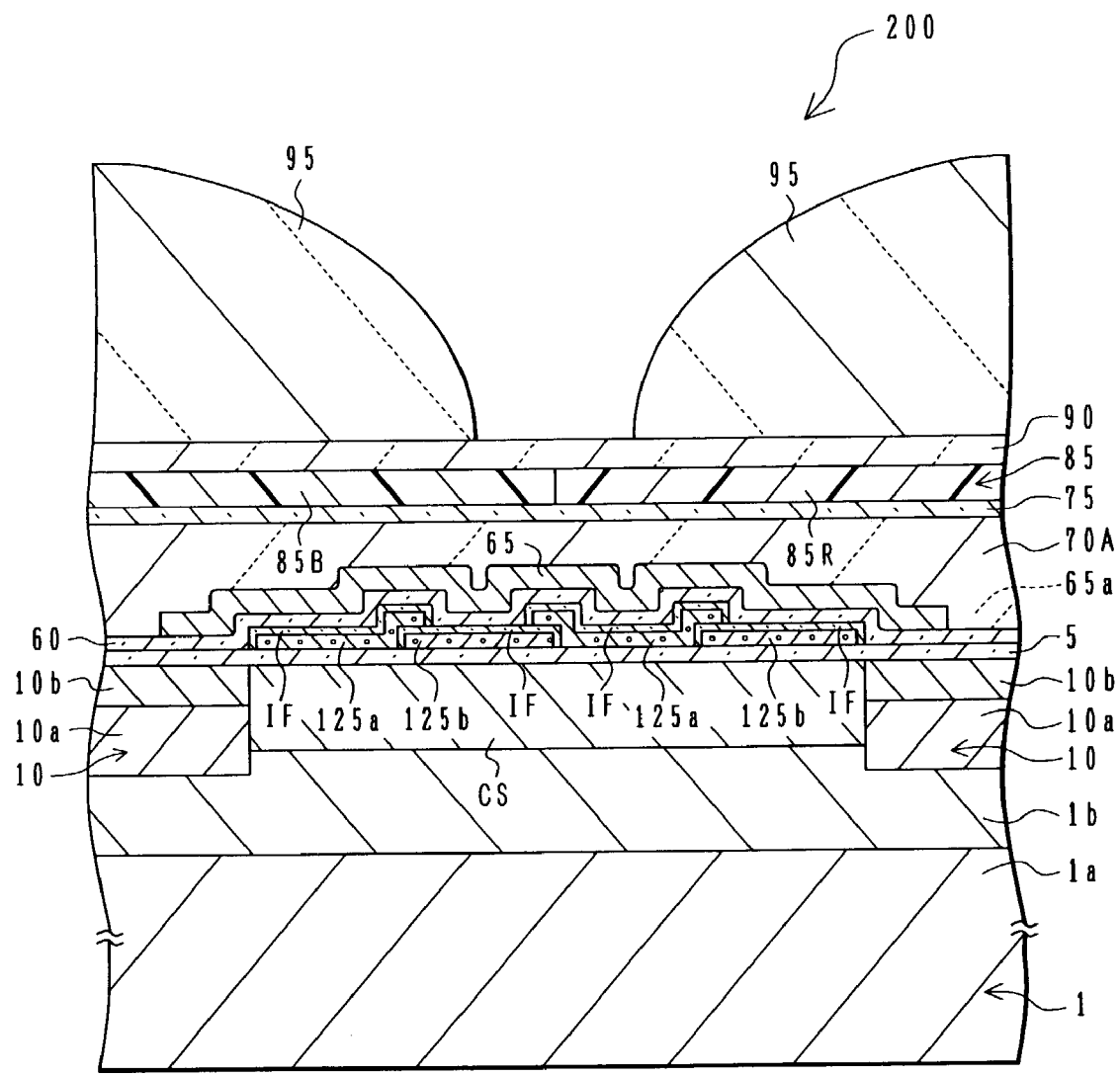
FIG. 9 is a cross sectional view taken along line IX—IX shown in FIG. 8.

FIG. 9 is a schematic cross sectional view showing the structure of the test device with micro lenses and taken along line IX—IX shown in FIG. 8.

The vertical charge transfer unit 20 of the solid state image pickup device 200 has the overlap electrode structure. In FIGS. 8 and 9, new reference symbols, which are given by adding 100 to the reference symbols shown in FIG. 4, are used for the transfer electrodes of the solid state image pickup device 200. Identical reference numerals and symbols to those used in FIG. 1 or 4 are used for other constituent elements, and the description thereof is omitted.

As shown in FIGS. 8 and 9, the edge of a transfer electrode 125a in the line width direction overlaps the edge of an adjacent transfer electrode 125b in the line width direction. The interlayer insulating film 70A is made of a BPSG film having a thickness of about 1.7 μm above the central area of the photoelectric conversion element 10. The passivation film 75 is made of a silicon nitride film having a thickness of about 0.2 μm.

An opening 65a formed through the light shielding film 65 above the photoelectric conversion element 10 is generally rectangular as viewed in plan, the size thereof being about 0.8×1.0 μm. The distance between the upper surface of the photoelectric conversion element 10 and the lower surface of the micro lens 95 is about 3.5 μm. The micro lens 95 is generally rectangular as viewed in plan and its size is about 2.85×2.85 μm.

For comparison, a solid state image pickup device (hereinafter called a "reference device") was prepared which had a similar structure to that of the test device, excepting that the device had the planarizing film 80 under the color filter array shown in FIG. 4 and that the underlying irregularity was reflected upon the upper surfaces of the interlayer insulating film and passivation film.

The interlayer insulating film of the reference device is made of a BPSG film having a thickness of about 0.7 μm above the central area of the photoelectric conversion element. The passivation film is made of a silicon nitride film having a thickness of about 0.2 μm above the central area of the photoelectric conversion element. The planarizing film under the color filter array is made of a photoresist layer having a thickness of about 2.0 μm above the central area of the photoelectric conversion element. The distance between the upper surface of the photoelectric conversion element and the lower surface of the micro lens is about 4.5 μm.

Figure 10:
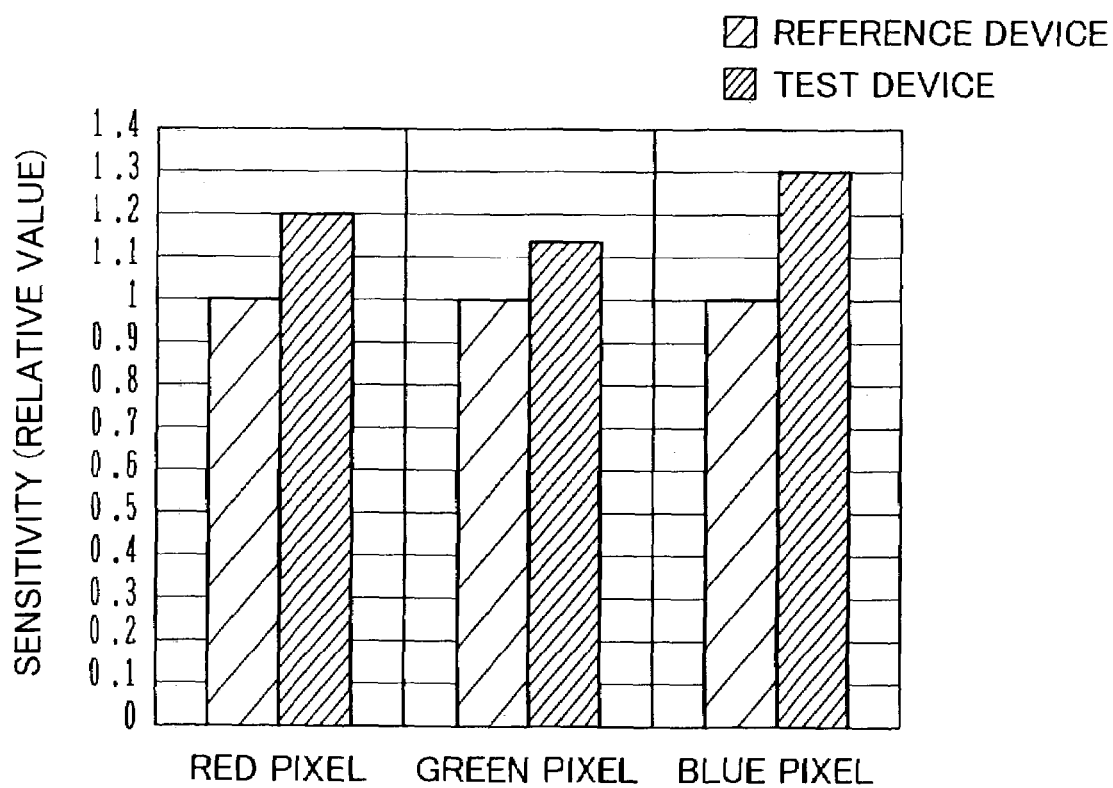
FIG. 10 is a graph showing the relative sensitivities of red, green and blue pixels of the solid state image pickup device shown in FIG. 8, with the sensitivities of a reference device being set to 1.

FIG. 10 is a graph showing the sensitivity of the test device relative to white light having a color temperature of 5100° K., the sensitivity being a relative value when the sensitivity of the reference device is set to 1. The sensitivities of the test and reference devices were measured for red, green and blue pixels.

A red pixel means a photoelectric conversion element having a red color filter disposed above the conversion element. The green and blue pixels mean photoelectric conversion elements having their color filters disposed above the conversion elements.

As seen from FIG. 10, the sensitivities of the test device are higher by 10% or more than those of the reference device for all red, green and blue pixels.

Figure 11:
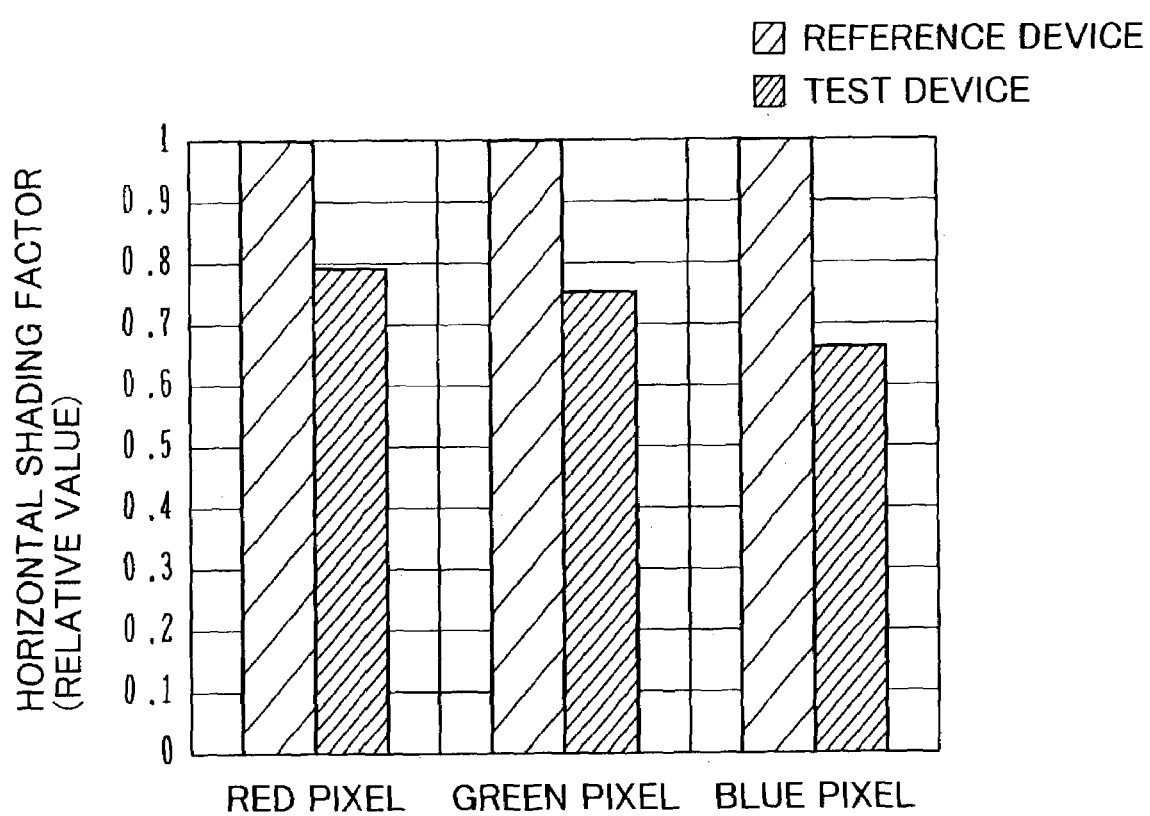
FIG. 11 is a graph showing the relative horizontal shading factors of red, green and blue pixels of the solid state image pickup device shown in FIG. 8, with the horizontal shading factor of a reference device being set to 1.

FIG. 11 is a graph showing the horizontal shading factor of the test device, the factor being a relative value when the factor of the reference device is set to 1.

The horizontal shading factors for red, green and blue pixels of the test and reference devices were calculated from the following equation by measuring pixel signals of one frame output from the charge detector circuit 50 when uniform light is applied:

Horizontal shading factor=

$$[(i_{max}-i_{min})/i_{ave}]\times 100$$

where $i_{max}$ is a maximum value of pixel signals, $i_{min}$ is a minimum value of pixel signals and $i_{ave}$ is an average value of pixel signals.

As seen from FIG. 11, the horizontal shading factors of the red, green and blue pixels of the test device are lower by 20% or more than those of the reference device.

Figure 12:
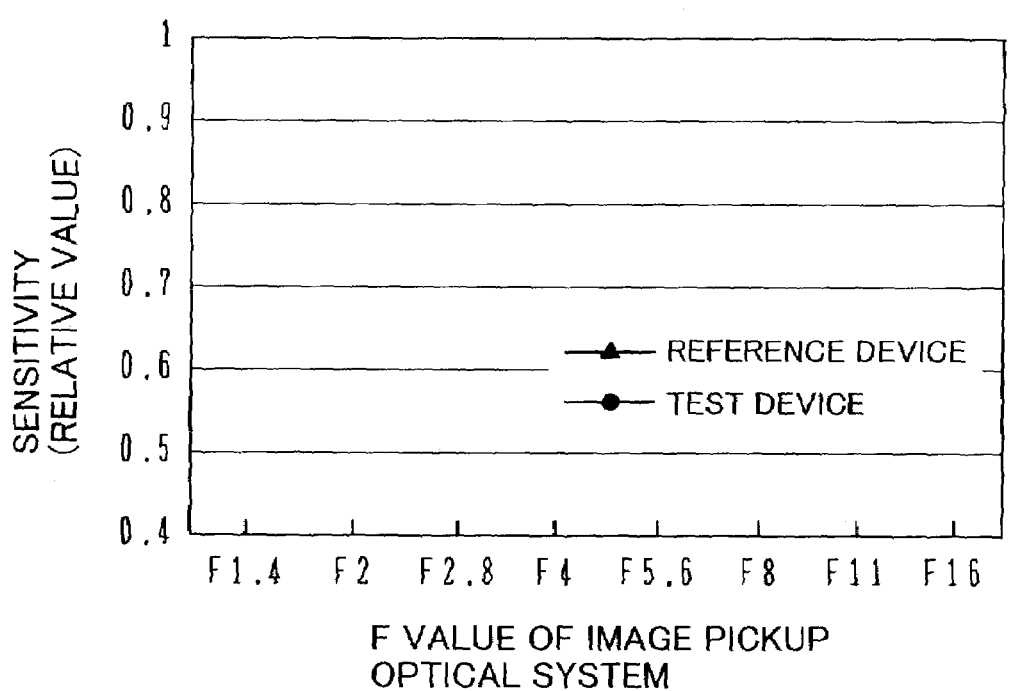
FIG. 12 is a graph showing the relation between the relative sensitivity of the solid state image pickup device shown in FIG. 8 and the F value of an image pickup optical system, with the sensitivities of a reference device being set to 1 at an F value of 8.

FIG. 12 is a graph showing the relation between the sensitivity and the F value of the image pickup optical systems of image pickup devices using the solid state image pickup devices of the test and reference devices, the sensitivity being a relative value when the sensitivities of the test and reference devices are set to 1 at the F value of 8.

As seen from FIG. 12, the sensitivity dependency upon the F value of the test device is lower than that of the reference device.

An improved sensitivity, a lowered horizontal shading factor and a lowered sensitivity dependency upon the F value of the image pickup optical system of the test device may be ascribed to (i) since the planarizing film 80 is omitted, the distance between the photoelectric conversion element 10 and micro lens 95 is shortened so that the focal point of the micro lens 95 comes near the photoelectric conversion element 10 and the amount of light incident upon the photoelectric conversion element 10 increases and (ii) since the interlayer insulating film 70A is planarized and the passivation film 75 is planarized by itself, the amount of light refracted at the surface of the passivation film toward an undesired direction reduces and the amount of light incident upon the photoelectric conversion element 10 increases.

These effects of the test device (solid state image pickup device 200) having vertical charge transfer units of the overlap electrode structure are also expected for the solid state image pickup device 150 of the second embodiment shown in FIG. 7. The effects include the improved sensitivity, lowered horizontal shading factor and lowered sensitivity dependency upon the F value of the image pickup optical system.

Even if the integration of the photoelectric conversion elements 10 is made even higher, it is expected to become easy to suppress a lowered sensitivity, an increased horizontal shading factor and an increased sensitivity dependency upon the F value of the image pickup optical system.

Next, a solid state image pickup device according to a third embodiment will be described.

Figure 13:
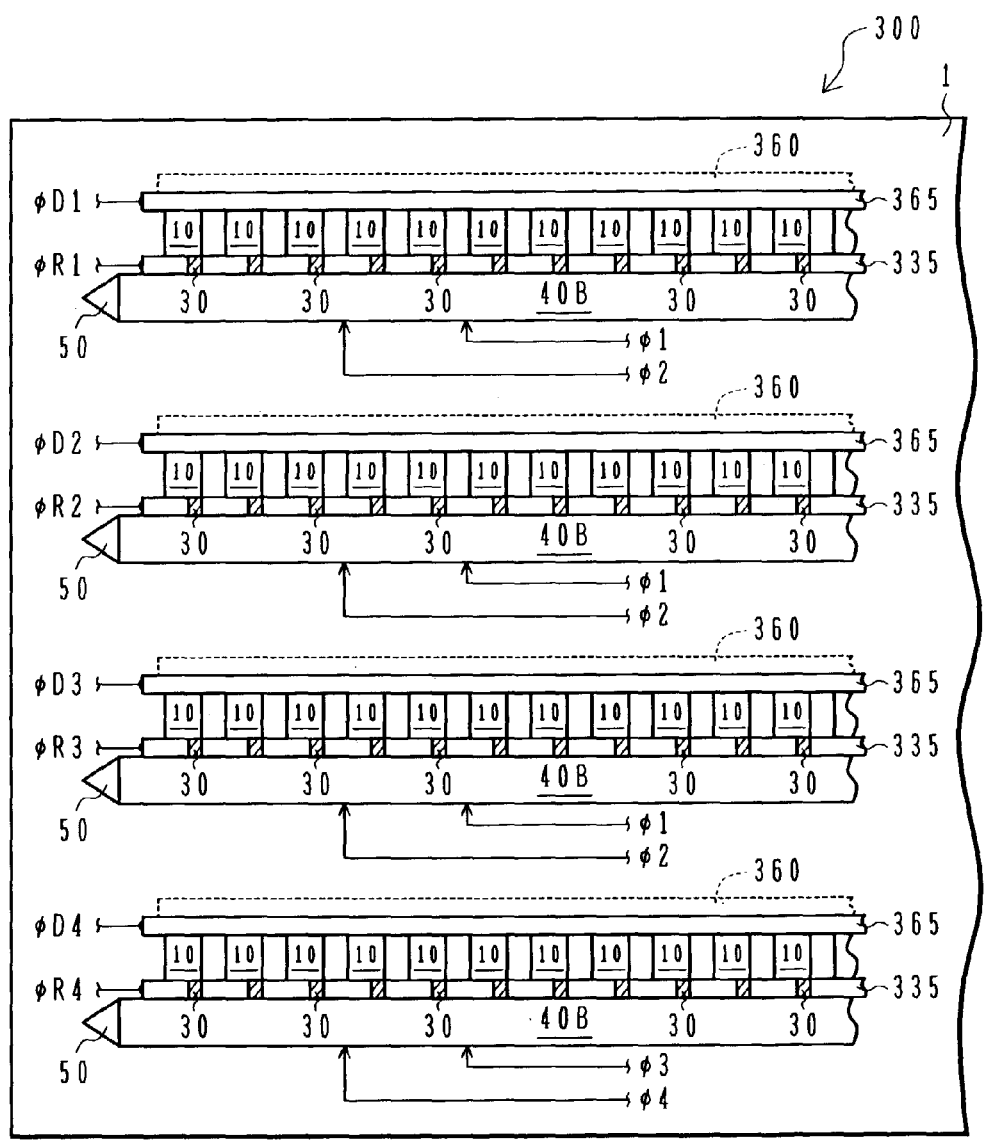
FIG. 13 is a plan view showing the layout of photoelectric conversion elements, charge transfer units, read gates, charge detector circuits and drains of a solid state image pickup device according to a third embodiment.

FIG. 13 is a schematic plan view showing the layout of photoelectric conversion elements, charge transfer units, read gates, charge detector circuits and drains respectively of the solid state image pickup device of the third embodiment. In FIG. 13, constituent elements common to those shown in FIG. 1 or 6 are represented by identical reference numerals and symbols and the description thereof is omitted.

The solid state image pickup device 300 is used as a linear image sensor for black and white and color. A number of photoelectric conversion elements 10 are disposed in four rows in the surface layer of a semiconductor substrate 1 of the solid state image pickup device 300.

A channel region for a read gate is formed in the semiconductor substrate 1 for each photoelectric conversion element 10. The channel regions for read gates in each photoelectric conversion element row are covered, as viewed in plan, with a read gate electrode 335 formed on an electrically insulating film on the semiconductor substrate 1 to thereby form read gates 30. The operation of each read gate 30 is controlled by a drive signal φR1, φR2, φR3 or φR4 applied to the read gate electrode 335. In FIG. 13, the read gate 30 is shown hatched in order to make it easy to locate it.

A charge transfer unit 40B is disposed for each photoelectric conversion element row along this row. In the charge transfer unit 40B, four transfer electrodes, for example, are provided for each photoelectric conversion element.

Each charge transfer unit 40B is electrically connectable to the photoelectric conversion elements 10 via the read gates 30. A charge detector circuit 50 is connected to an output end of each charge transfer unit 40B.

A drain region 360 is disposed for each photoelectric conversion element row along this row. The drain region 360 is made of, for example, an $n^+$-type impurity doped region formed in the semiconductor substrate 1. A channel region is disposed between the drain region 360 and the photoelectric conversion element row. This channel region is covered, as viewed in plan, with a gate electrode 365 formed on an electrically insulating film on the semiconductor substrate 1 to thereby form a gate. The operation of this gate is controlled by a drive signal φD1, φD2, φD3 or φD4 applied to the gate electrode 365.

In the solid state image pickup device 300, pixel signals for a color image are generated from charges accumulated in the upper three photoelectric conversion element rows. Red, green and blue filters are disposed above the upper three photoelectric conversion element rows. The charge transfer units 40B of the upper three photoelectric conversion element rows are driven by two-phase drive signals φ1 and φ2 to transfer the charges read from the photoelectric conversion elements 10 to the charge detector circuit 50.

Charges accumulated in the last one photoelectric conversion element row are used for generating pixel signals of a black and white image. A monochromatic coloring layer corresponding to the color filters for a color image or a transparent layer is disposed above the photoelectric conversion element row. The charge transfer unit 40B of the photoelectric conversion element row is driven by two-phase drive signals φ3 and φ4 to transfer charges read from the photoelectric conversion elements 10 to the charge detector circuit 50.

In a solid state image pickup device used as a linear image sensor, a light shielding film is not formed in many cases. Also in many cases, a light converging element such as a micro lens is not disposed above the photoelectric conversion element. A light shielding film and micro lenses are provided if necessary. In place of micro lenses, a cylindrical lens may be disposed for each photoelectric conversion element row.

As compared to a solid state image pickup device used as an area image sensor, a solid state image pickup device used as a linear image sensor is often not required to shorten the distance between the upper surface of the photoelectric conversion element and the lower surface of the light converging element.

If the transfer electrodes of the charge transfer unit are made to have the same structure as that of the transfer electrodes 45a and 45b shown in FIG. 6 and a micro lens is disposed above the photoelectric conversion element, the effects similar to those of the solid state image pickup device 100 of the first embodiment can be obtained.

It becomes easy to lower the manufacture cost. For example, in order to form transfer electrodes of the overlap electrode structure by photolithography techniques, it is necessary to use masks having predetermined patterns at the first and second transfer electrode forming processes.

If the transfer electrodes are formed to have the same structure as that of the transfer electrodes 45a and 45b, the number of masks necessary for forming these transfer electrodes can be reduced by one.

If the interlayer insulating film is planarized as shown in FIG. 7, desired layers can be formed in later processes without considering the underlying pattern dependency, and the planarizing film can be omitted to improve the manufacture yield.

For these reasons, it becomes easy to lower the manufacture cost. The same advantages are also obtained for the solid state image pickup device used as an area image sensor such as the solid state image pickup devices 100 and 150 of the first and second embodiment.

Next, a semiconductor device according to a fourth embodiment will be described.

FIG. 14 is a schematic cross sectional view of a semiconductor device of the fourth embodiment. The semiconductor device 400 has: a p-type semiconductor substrate 401; a field oxide film 410 formed on the surface of the p-type semiconductor substrate 401 for defining active regions 403 and 406; a p-channel MOS field effect transistor (FET) 420 formed in the active region 403; an n-channel MOSFET 430 formed in the active region 406; a plurality of signal lines 450 disposed on the field oxide film 410; and an interlayer insulating film 460 covering these elements.

The active region 403 is formed in an n-type well in which p-type drain and source regions 421 and 422 are formed spaced apart from each other. A gate electrode 425 made of, for example, polysilicon, is formed on a gate insulating film 427 in the active region 403. The drain region 421, source region 422, gate insulating film 427 and gate electrode 425 constitute the p-channel MOSFET 420.

The active region 406 is formed in a p-type well in which n-type drain and source regions 431 and 432 are formed spaced apart from each other. A gate electrode 435 made of, for example, polysilicon, is formed on a gate insulating film 437 in the active region 406. The drain region 431, source region 432, gate insulating film 437 and gate electrode 435 constitute the n-channel MOSFET 430.

The drain regions 421 and 431 are electrically connected via contact plugs P1 and P2 formed through the interlayer insulating film 460 and an upper wiring layer 470. The p-channel MOSFET 420 and n-channel MOSFET 430 constitute a complementary MOSFET transistor 440.

The source region 422 is connected to the upper wiring layer 471 via a contact plug formed through the interlayer insulating film 460, and the source region 432 is connected to an upper wiring layer 472 via a contact plug formed through the interlayer insulating film 460.

Similar to the transfer electrodes 25a and 25b shown in FIG. 2, each signal line 450 is formed of a striped main electrode layer 450M and side wall subsidiary electrode layers 450S formed on the side walls of the main electrode layer 450M and having a rounded shoulder cross section. Each signal line 450 is covered with an electrically insulating film IF.

In the semiconductor device 400 shown in FIG. 14, even if the main electrode layers 450M are formed at an interval of about 0.3 μm, the distance between adjacent signal lines 450 can be easily set to about 0.2 μm or shorter. It is easy to set this distance to about 0.1 μm or shorter. It is easy to improve the integration at a relatively low manufacture cost.

The present invention has been described in connection with the preferred embodiments. The invention is not limited only to the above embodiments. For example, the structures of elements other than the transfer electrodes of a charge transfer unit may be changed in various ways.

In a solid state image pickup device used as an area image sensor, a number of photoelectric conversion elements may be disposed in a square matrix shape in a plurality of rows and columns. The "square matrix shape" includes a shape having different numbers of rows and columns.

The number of transfer electrodes of a vertical charge transfer unit may be one, three or more per one photoelectric conversion element row. The number of transfer electrodes of a horizontal charge transfer unit may be two or more per one vertical charge transfer unit.

The number of phases of drive signals for driving the vertical and horizontal charge transfer units is determined as desired in accordance with the number of transfer electrodes per one photoelectric conversion element row, the number of transfer electrodes per one vertical charge transfer unit, the drive methods for the vertical and horizontal charge transfer units and the like. This is also applicable to the charge transfer unit of a solid state image pickup device used as a linear image sensor.

The number of photoelectric conversion element rows of a solid state image pickup device used as a linear image sensor is determined as desired in accordance with its application.

The transfer electrode fabrication method is not limited only to the method described with reference to FIGS. 3A to 3E. It may be determined as desired in accordance with the materials of the main electrode layer and side wall subsidiary electrode layers.

FIGS. 15A to 15E are cross sectional views illustrating the processes of forming a main electrode layer EM of polysilicon and a side wall subsidiary layer of metal silicide. In FIGS. 15A to 15E, constituent elements common to those shown in FIGS. 3A to 3E are represented by the identical reference numerals and symbols and the description thereof is omitted.

Figure 15A:
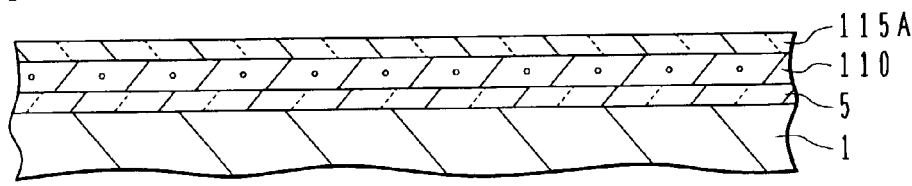
FIGS. 15A to 15E are cross sectional views illustrating the processes of forming transfer electrodes by using a main electrode layer of polysilicon and a subsidiary electrode layer of metal silicide.
Figure 15B:
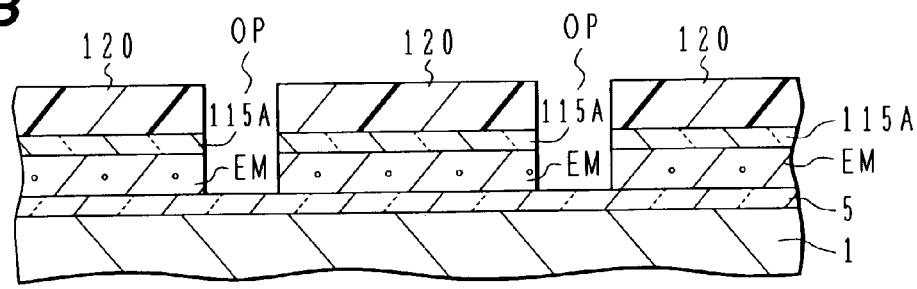

As shown in FIGS. 15A and 15B, a polysilicon layer 110 is patterned to form main electrode layers EM by the processes similar to those described with reference to FIGS. 3A and 3B. An electrically insulating layer 115A such as a silicon oxide film and a silicon nitride film is deposited on the polysilicon layer 110. The electrically insulating layer 115A may or may not have an etching stopper function. After the main electrode layers EM are formed, a resist mask 120 is removed.

Figure 15C:
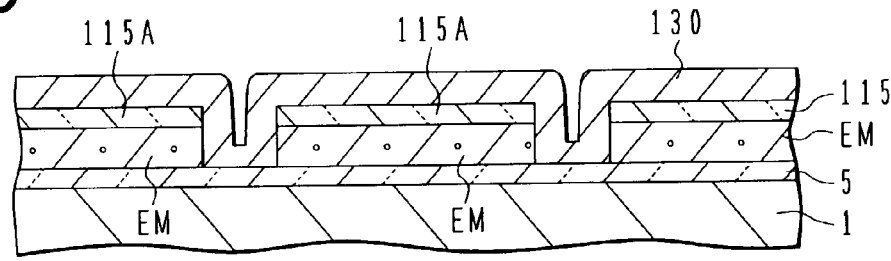

As shown in FIG. 15C, a metal layer 130 to be used as the material of the side wall subsidiary layers is deposited on the electrically insulating layer 115A and on the exposed surface of an electrically insulating layer 5.

Prior to the deposition of the metal layer 130, a natural film formed on the surface of the main electrode layer EM is preferably removed by, e.g., a gas phase hydrofluoric acid process.

The metal layer 130 is made of metal capable of being silicidated such as cobalt, chrome, nickel, tungsten, titanium, molybdenum and tantalum. The thickness of the metal layer 130 is preferably thinner than a half of the distance between adjacent two main electrode layers EM.

Heat treatment is preformed by rapid thermal anneal (RTA) or the like. This heat treatment is performed in an inert gas atmosphere such as nitrogen gas and argon gas. The heat treatment conditions are determined as desired in accordance with the material of the metal layer 130.

This heat treatment makes silicon of the main electrode layer EM react with the metal layer 130 at the interface where the main electrode layer EM and metal layer 130 contact directly, and forms a silicide layer. In this manner, a self aligned silicide (salicide) process is performed.

Figure 15D:
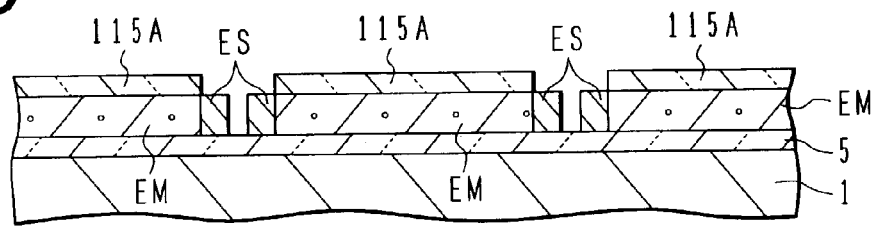

As shown in FIG. 15D, the unreacted metal layer 130 is removed by a mixture liquid of ammonium and hydrogen peroxide or the like. The silicide layers are therefore left only on the side walls of the main electrode layer, forming the side wall subsidiary electrode layers ES. A transfer electrode having the main electrode layer EM and side wall subsidiary electrode layers ES is therefore obtained.

Figure 15E:
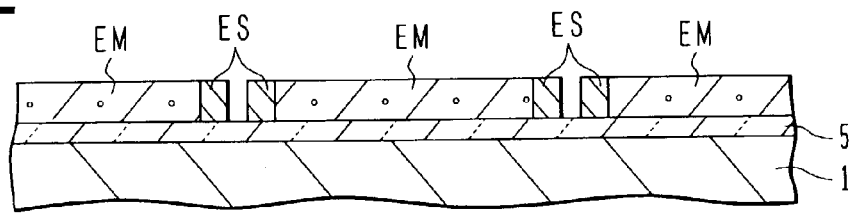

As shown in FIG. 15E, the electrically insulating layer 115A is removed. For example, if the electrically insulating film 115A is made of a silicon nitride film, it can be removed by hot phosphoric acid.

After the side wall subsidiary layers ES are formed, if necessary, the side wall subsidiary electrode layers ES are subjected to heat treatment by RTA or the like to improve the conductivity of the layers ES. This heat treatment is performed in an inert gas atmosphere such as nitrogen gas and argon gas, and the heat treatment conditions are determined as desired in accordance with the composition of the side wall subsidiary layer ES. This heat treatment may be performed before or after the process described with FIG. 15E.

If the electrically insulating film 115A is omitted, a metal silicide layer is formed also on the upper surface of the main electrode layer EM.

The side wall subsidiary layer ES made of metal silicide may be formed by salicide techniques or by depositing a metal silicide layer in place of the conductive layer 115 shown in FIG. 3.

Although the passivation film is used for the solid state image pickup devices of the embodiments, it may be omitted.

The structure and layout of the transfer electrodes described with reference to FIG. 2, FIGS. 3A to 3E, and FIGS. 15A to 15E may be applied to signal lines of various semiconductor devices other than solid state image pickup devices. By using these structure and layout, it becomes easy to improve the integration of a semiconductor device.

It is apparent that various modifications, improvements, combinations, and the like can be made by those skilled in the art.

We claim:

1. A solid state image pickup device comprising:
    a semiconductor substrate;
    a number of photoelectric conversion elements disposed in one surface of said semiconductor substrate in rows and columns in a pixel shift layout, in which each of photoelectric conversion elements of an even column is shifted by about a half pitch along the column direction from those of an odd column, and each of photoelectric conversion elements of an even row is shifted by about a half pitch along the row direction from those of an odd row;
    a plurality of first charge transfer channels formed in the surface of said semiconductor substrate, each of said first charge transfer channels running in a zigzag manner along a corresponding photoelectric conversion element column, and extending into spaces between pairs of vertically adjacent photoelectric conversion elements;
    a plurality of first transfer electrodes disposed on an electrically insulating film formed on the surface of said semiconductor substrate along each photoelectric conversion element row, adjacent first transfer electrodes being disposed spaced apart from each other, and each of said first transfer electrodes having a first main electrode layer disposed crossing each of said first charge transfer channels as viewed in plan and first subsidiary electrode layers formed on side walls of the first main electrode layer;
    a second charge transfer channel formed in the surface of said semiconductor substrate and being electrically connectable to each of said first charge transfer channels; and
    a plurality of second transfer electrodes disposed on the electrically insulating film formed on the surface of said semiconductor substrate, each of said second transfer electrodes crossing said second charge transfer channel.

2. A solid state image pickup device according to claim 1, further comprising:
    a light shielding film having an opening above each of said photoelectric conversion elements, said light shielding film being electrically separated from each of said first and second transfer electrodes and covering each of said first and second transfer electrodes as viewed in plan;
    an interlayer insulating film having a flat upper surface, made of material containing silicon oxide, and covering said light shielding film and said openings as viewed in plan; and
    a passivation film disposed on said interlayer insulating film.

3. A solid state image pickup device according to claim 1, wherein each of said second transfer electrodes includes a second main electrode layer disposed crossing said second charge transfer channel as viewed in plan and a second subsidiary electrode layer formed on side walls of the second main electrode layer.

4. A solid state image pickup device according to claim 1, wherein a distance between adjacent first transfer electrodes is 0.1 µm or shorter.

* * * * *